(12) United States Patent
Maruyama et al.

(10) Patent No.: US 11,545,502 B2
(45) Date of Patent: Jan. 3, 2023

(54) MANUFACTURING METHOD OF SEMICONDUCTOR DEVICE

(71) Applicant: RENESAS ELECTRONICS CORPORATION, Tokyo (JP)

(72) Inventors: Takuya Maruyama, Tokyo (JP); Takahiro Maruyama, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 84 days.

(21) Appl. No.: 17/032,839

(22) Filed: Sep. 25, 2020

(65) Prior Publication Data

US 2021/0118897 A1  Apr. 22, 2021

(30) Foreign Application Priority Data

Oct. 17, 2019  (JP) .............................. JP2019-190492

(51) Int. Cl.
| | |
|---|---|
| *H01L 27/11568* | (2017.01) |
| *H01L 29/423* | (2006.01) |
| *H01L 29/66* | (2006.01) |
| *H01L 21/28* | (2006.01) |

(52) U.S. Cl.
CPC .. *H01L 27/11568* (2013.01); *H01L 29/40117* (2019.08); *H01L 29/42344* (2013.01); *H01L 29/66833* (2013.01)

(58) Field of Classification Search
CPC .................... H01L 27/11568; H01L 29/40117
See application file for complete search history.

(56) References Cited

U.S. PATENT DOCUMENTS

| | | | |
|---|---|---|---|
| 9,685,565 B2 | 6/2017 | Mizutani et al. | |
| 2016/0064397 A1* | 3/2016 | Hayashi | H01L 29/40117 438/275 |

FOREIGN PATENT DOCUMENTS

JP    2015-053474 A    3/2015

\* cited by examiner

*Primary Examiner* — Mohammad M Choudhry
(74) *Attorney, Agent, or Firm* — McDermott Will & Emery LLP

(57) ABSTRACT

A manufacturing method of a semiconductor device includes: (a) forming a gate structure for a control gate electrode on a semiconductor substrate; (b) forming a charge storage film so as to cover a first side surface, a second side surface, and an upper surface of the gate structure; (c) forming a conductive film for a memory gate electrode on the charge storage film; (d) removing a part of the charge storage film and a part of the conductive film such that the charge storage film and the conductive film remain in this order on the first side surface and the second side surface of the gate structure, thereby forming the memory gate electrode; and (e) removing apart of the gate structure separate from the first side surface and the second side surface such that a part of the semiconductor substrate is exposed from the gate structure.

12 Claims, 18 Drawing Sheets

MANUFACTURING METHOD OF SEMICONDUCTOR DEVICE

CROSS-REFERENCE TO RELATED APPLICATION

The disclosure of Japanese Patent Application No. 2019-190492 filed on Oct. 17, 2019 including the specification, drawings and abstract is incorporated herein by reference in its entirety.

TECHNICAL FIELD OF THE INVENTION

The present invention relates to a manufacturing method of a semiconductor device, and relates to, for example, a manufacturing method of a semiconductor device having a memory element.

BACKGROUND OF THE INVENTION

A semiconductor device having an electrically writable and erasable flash memory has been known. For example, the flash memory includes a semiconductor substrate, a control gate electrode, a memory gate electrode, and a charge storage film (for example, see Japanese Patent Application Laid-Open Publication No. 2015-053474 (Patent Document 1)). The control gate electrode and the memory gate electrode are formed on the semiconductor substrate. The charge storage film is formed between the control gate electrode and the memory gate electrode and between the semiconductor substrate and the memory gate electrode. Writing and erasing of the flash memory are performed by injecting charges into the charge storage film or by drawing out charges from the charge storage film.

The manufacturing method of the semiconductor device described in Patent Document 1 includes (a) a step of forming the control gate electrode on the semiconductor substrate, (b) a step of forming the charge storage film on the semiconductor substrate so as to cover a first side surface, a second side surface, and an upper surface of the control gate electrode, (c) a step of forming a conductive film for the memory gate electrode on the charge storage film, and (d) a step of removing the charge storage film and the conductive film formed on the second side surface and the upper surface of the control gate electrode such that the charge storage film and the conductive film remain in this order on the first side surface of the control gate electrode.

SUMMARY OF THE INVENTION

In the manufacturing method of the semiconductor device described in Patent Document 1, the charge storage film is once formed on the second side surface of the control gate electrode in the step (b), and then the charge storage film is removed from the second side surface in the step (d). Depending on manufacturing conditions, the charge storage film is not sufficiently removed from the second side surface and a residue of the charge storage film may remain on the second side surface in some cases. This residue becomes a cause for the foreign matter in the step after the step (d). As a result, the desired characteristics of the semiconductor device may not be obtained. As described above, the conventional manufacturing method of the semiconductor device has room for improvement from the viewpoint of enhancing the characteristics of the semiconductor device.

An object of the embodiment is to enhance the characteristics of the semiconductor device. Other objects and novel features will be apparent from the descriptions of the specification and the drawings.

A manufacturing method of a semiconductor device according to an embodiment includes (a) to (e) described below. In (a), a gate structure for a control gate electrode is formed on a semiconductor substrate via a gate insulating film. In (b), a charge storage film is formed on the semiconductor substrate so as to cover a first side surface, a second side surface, and an upper surface of the gate structure. In (c), a first conductive film for a memory gate electrode is formed on the charge storage film. In (d), a part of the charge storage film and a part of the first conductive film are removed such that the charge storage film and the first conductive film remain in this order on the first side surface and the second side surface of the gate structure on the semiconductor substrate, thereby forming the memory gate electrode. In (e), a part of the gate structure separate from the first side surface and the second side surface is removed such that a part of the semiconductor substrate is exposed from the gate structure.

According to the embodiment, it is possible to enhance the characteristics of the semiconductor device.

BRIEF DESCRIPTIONS OF THE DRAWINGS

DESCRIPTIONS OF THE PREFERRED EMBODIMENTS

Figure 1:
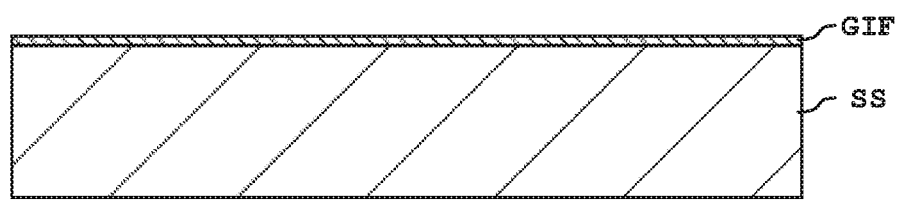
FIG. 1 is a cross-sectional view showing an example of each step included in a manufacturing method of a semiconductor device according to the first embodiment.
Figure 2:
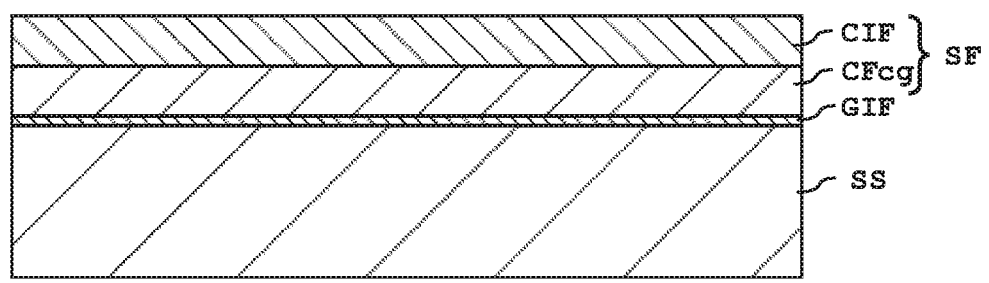
FIG. 2 is a cross-sectional view showing an example of each step included in the manufacturing method of the semiconductor device according to the first embodiment.

The semiconductor device according to each embodiment will be described below in detail with reference to drawings. Note that the same components or corresponding components are denoted by the same reference signs in the specification and drawings and redundant description will be omitted. Also, in the drawings, for convenience of explanation, the configuration will be omitted and simplified in some cases. At least parts of each embodiment and modification may be combined with each other as appropriate. Further, the cross-sectional view is shown as an end view in some cases.

First Embodiment (Manufacturing Method of Semiconductor Device)

An example of a manufacturing method of a semiconductor device SD1 according to the first embodiment will be described. FIG. 1 to FIG. 15 are cross-sectional views showing an example of each step included in the manufacturing method of the semiconductor device SD1.

The manufacturing method of the semiconductor device SD1 according to the first embodiment includes 1. a step of forming a gate structure GS1, 2. a step of forming a charge storage film CSF, 3. a step of forming a conductive film CFmg for a memory gate electrode MG, 4. a step of forming the memory gate electrode MG, 5. a step of removing a part of the gate structure GS1, 6. a step of forming a first impurity region IPR1, 7. a step of forming a sidewall SW, 8. a step of forming a second impurity region IPR2, and 9. a step of forming a multilayer wiring layer.

1. Formation of Gate Structure GS1

The step of forming the gate structure GS1 includes (1) a step of preparing a semiconductor substrate SS, (2) a step of forming a stacked film SF, (3) a step of forming a first gate structure portion GSP1 and a second gate structure portion GSP2, and (4) a step of forming a sacrificial layer SCL.

(1) Preparation of Semiconductor Substrate SS

First, as shown in FIG. 1, the semiconductor substrate SS is prepared, and a gate insulating film GIF is formed on the semiconductor substrate SS. The semiconductor substrate SS is a single crystal silicon substrate having a specific resistance of 1 Ωcm or more and 10 Ωcm or less. The semiconductor substrate SS has, for example, an impurity region containing a p-type impurity. Examples of the p-type impurity include boron (B) and aluminum (Al). Although not particularly shown, an insulating film for element isolation may be previously formed in the semiconductor substrate SS.

The method of forming the gate insulating film GIF is, for example, the thermal oxidation method. The gate insulating film GIF is formed by, for example, thermally oxidizing a main surface of the semiconductor substrate SS. The material of the gate insulating film GIF is, for example, silicon oxide. Note that the gate insulating film GIF is a gate insulating film for a control gate electrode CG.

(2) Formation of Stacked Film SF

Next, the stacked film SF in which a conductive film CFcg for the control gate electrode CG and a cap insulating film CIF are stacked in this order is formed on the gate insulating film GIF.

The method of forming the conductive film CFcg is, for example, the CVD (Chemical Vapor Deposition) method. The material of the conductive film CFcg is, for example, polysilicon. The thickness of the conductive film CFcg is adjusted as appropriate in accordance with the desired thickness of the control gate electrode CG. For example, the thickness of the conductive film CFcg is 40 nm or more and 100 nm or less.

The method of forming the cap insulating film CIF is, for example, the CVD method. Examples of the material of the cap insulating film CIF include silicon oxide and silicon nitride. The cap insulating film CIF may be a single-layer film or a stacked film made up of two or more layers. The thickness of the cap insulating film CIF may be adjusted in accordance with the desired thickness of the memory gate electrode MG. For example, the thickness of the cap insulating film CIF is preferably 20 nm or more and 100 nm or less.

(3) Formation of First Gate Structure Portion GSP1 and Second Gate Structure Portion GSP2

Figure 3:
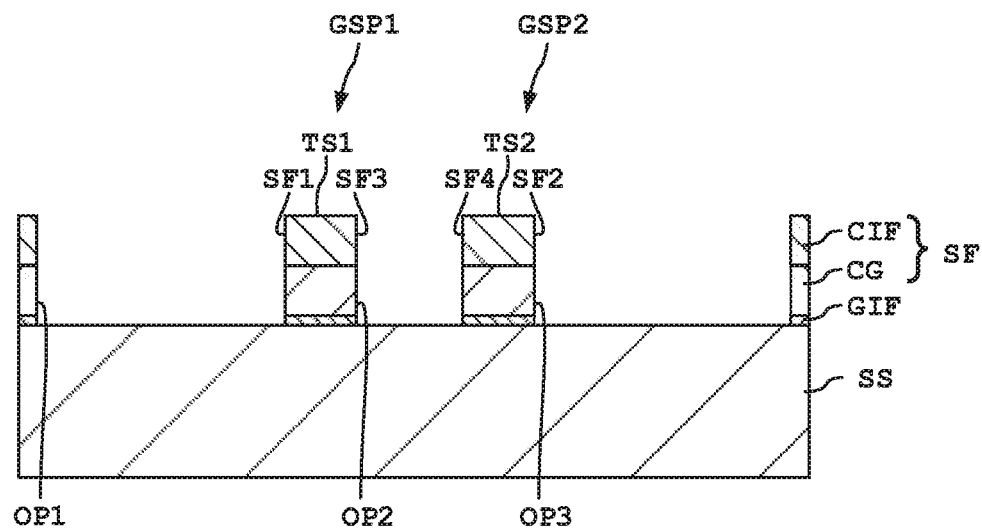
FIG. 3 is a cross-sectional view showing an example of each step included in the manufacturing method of the semiconductor device according to the first embodiment.

Next, as shown in FIG. 3, a part of the stacked film SF is removed to form the first gate structure portion GSP1 and the second gate structure portion GSP2. More specifically, at least a part of the cap insulating film CIF and a part of the conductive film CFcg are removed. Consequently, the control gate electrode CG is formed. The stacked film SF is removed by, for example, the photolithography method and the etching method.

At this time, the plurality of first gate structure portions GSP1 and the plurality of second gate structure portions GSP2 are formed so as to be alternately and repeatedly arranged. In FIG. 3, a pair of the first gate structure portion GSP1 and the second gate structure portion GSP2 is mainly shown.

The first gate structure portion GSP1 has a first side surface SF1 and a third side surface SF3 located on opposite sides to each other and a first upper surface TS1. The second gate structure portion GSP2 has a second side surface SF2 and a fourth side surface SF4 located on opposite sides to each other and a second upper surface TS2. The third side surface SF3 of the first gate structure portion GSP1 and the fourth side surface SF4 of the second gate structure portion GSP2 face each other.

In a cross section orthogonal to the extending direction of the first gate structure portion GSP1 and the second gate structure portion GSP2, an opening is formed between the first gate structure portion GSP1 and the second gate structure portion GSP2 adjacent to each other. In the first embodiment, as shown in FIG. 3, a first opening OP1 and a second opening OP2 are formed so as to sandwich the first gate structure portion GSP1. The second opening OP2 and a third opening OP3 are formed so as to sandwich the second gate structure portion GSP2. The first side surface SF1 of the first gate structure portion GSP1 is exposed in the first opening OP1. The third side surface SF3 of the first gate structure portion GSP1 and the fourth side surface SF4 of the second gate structure portion GSP2 are exposed in the second opening OP2. Namely, the first gate structure portion GSP1 and the second gate structure portion GSP2 are separated from each other via the opening OP2. Further, the second side surface SF2 of the second gate structure portion GSP2 is exposed in the third opening OP3.

The gate insulating film GIF may be removed or may not be removed in this step. Namely, either the gate insulating film GIF or the semiconductor substrate SS may be exposed in each of the first opening OP1, the second opening OP2, and the third opening OP3. In the first embodiment, the gate insulating film GIF exposed from the control gate electrode CG is removed. Namely, a part of the semiconductor substrate SS is exposed in each of the first opening OP1, the second opening OP2, and the third opening OP3.

(4) Formation of Sacrificial Layer SCL

Figure 4:
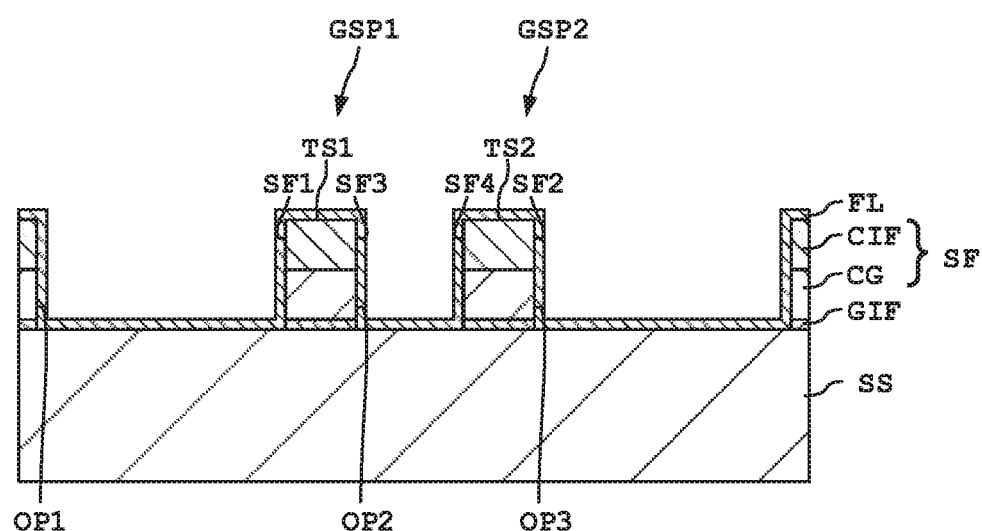
FIG. 4 is a cross-sectional view showing an example of each step included in the manufacturing method of the semiconductor device according to the first embodiment.
Figure 5:
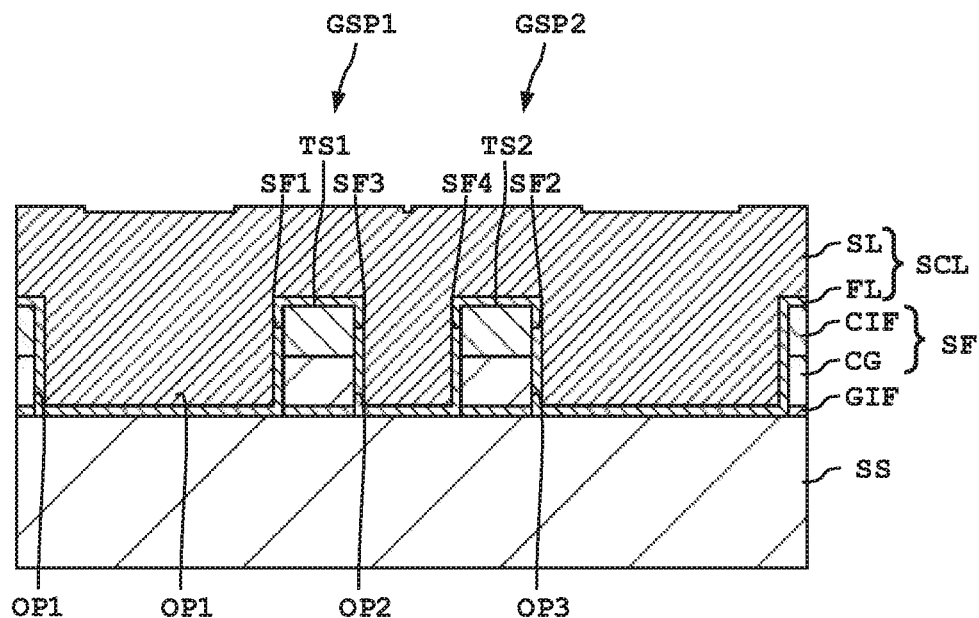
FIG. 5 is a cross-sectional view showing an example of each step included in the manufacturing method of the semiconductor device according to the first embodiment.

Next, as shown in FIG. 4 and FIG. 5, the sacrificial layer SCL is formed on the semiconductor substrate SS so as to fill at least the second opening OP2. Although the detail will be described later, in the first embodiment, the step of forming the sacrificial layer SCL includes (4-1) a step of forming a first layer FL, (4-2) a step of forming a second layer SL, and (4-3) a polishing step.

In the first embodiment, the sacrificial layer SCL is formed on the semiconductor substrate SS so as to fill each of the first opening OP1, the second opening OP2, and the third opening OP3. Namely, the sacrificial layer SCL is formed so as to cover the first side surface SF1, the third side surface SF3, and the first upper surface TS1 of the first gate structure portion GSP1 and the second side surface SF2, the fourth side surface SF4, and the second upper surface TS2 of the second gate structure portion GSP2. The sacrificial layer SCL is preferably formed so as to fill at least the second opening OP2.

The sacrificial layer SCL may be a single-layer film or a stacked film made up of two or more layers. In the first embodiment, the sacrificial layer SCL is a stacked film including the first layer FL and the second layer SL. As described above, in the first embodiment, the step of forming the sacrificial layer SCL includes (4-1) a step of forming the first layer FL, (4-2) a step of forming the second layer SL, and (4-3) a patterning step.

(4-1) Formation of First Layer FL

First, as shown in FIG. 4, the first layer FL is formed on at least the inner surface of the second opening OP2. In the first embodiment, the first layer FL is formed on the semiconductor substrate SS so as to cover the first gate structure portion GSP1 and the second gate structure portion GSP2. The method of forming the first layer FL is, for example, the CVD method. Any material and thickness can be applied as those of the first layer FL as long as the first layer FL can suitably cover at least the inner surface of the second opening OP2. Examples of the material of the first layer FL include silicon oxide. The thickness of the first layer FL is, for example, 3 nm or more and 10 nm or less.

(4-2) Formation of Second Layer SL

Next, as shown in FIG. 5, the second layer SL is formed on the first layer FL so as to fill at least the second opening OP2. In the first embodiment, the second layer SL is formed on the first layer FL so as to fill the inside of each of the first opening OP1, the second opening OP2, and the third opening OP3 and cover the first gate structure portion GSP1 and the second gate structure portion GSP2. The method of forming the second layer SL is, for example, the CVD method. The material and thickness of the second layer SL are not particularly limited as long as the second layer SL can suitably fill at least the second opening OP2. Examples of the material of the second layer SL include polysilicon. The thickness of the second layer SL is, for example, 100 nm or more and 300 nm or less.

As described above, the sacrificial layer SCL may be a single-layer film. When the sacrificial layer SCL is a single-layer film, the sacrificial layer SCL is the second layer SL. From the viewpoint of reducing the manufacturing cost, the sacrificial layer SCL is preferably a single-layer film. From the viewpoint of reducing the damage on the semiconductor substrate SS when removing the sacrificial layer in the patterning step described later, the sacrificial layer SCL is preferably a stacked film.

(4-3) Patterning Step

Figure 6:
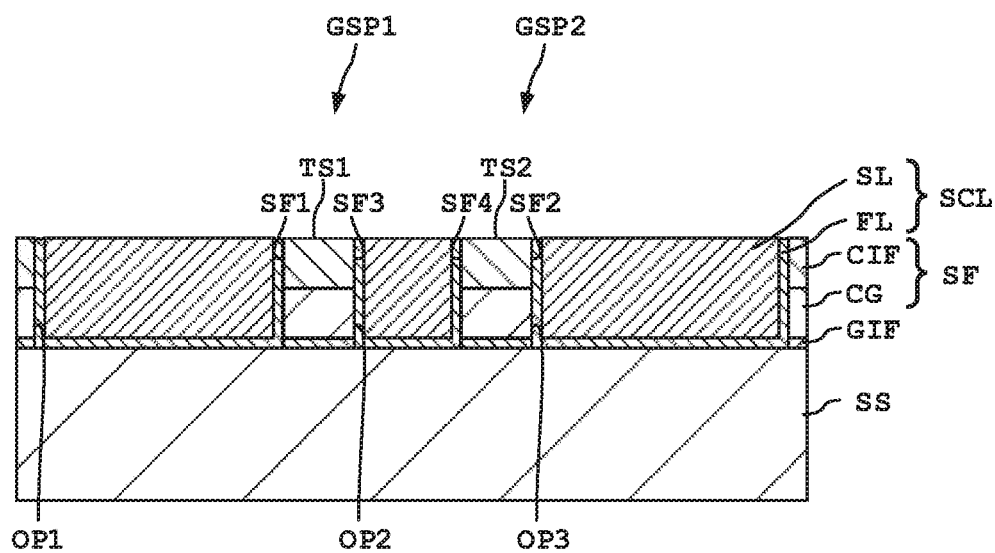
FIG. 6 is a cross-sectional view showing an example of each step included in the manufacturing method of the semiconductor device according to the first embodiment.
Figure 7:
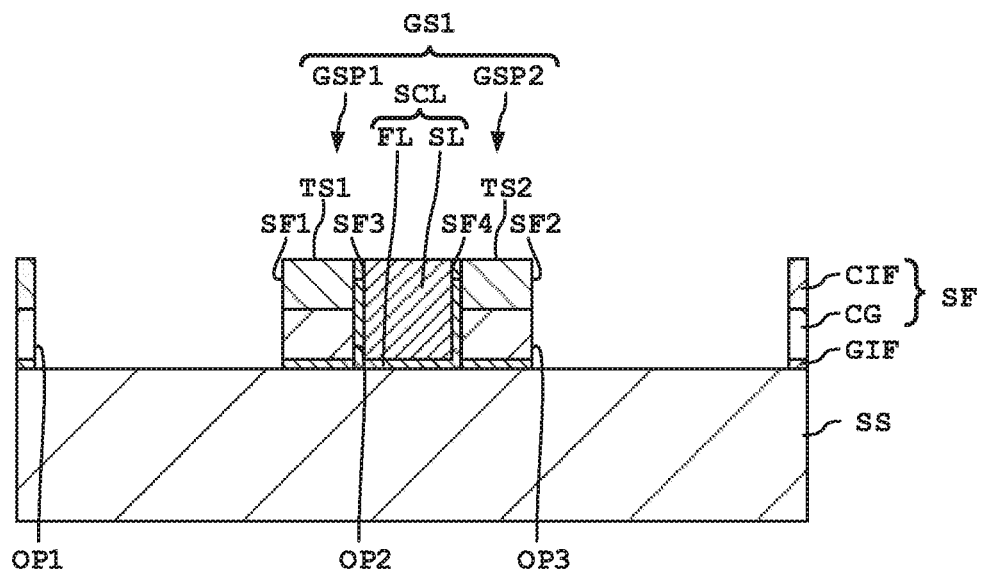
FIG. 7 is a cross-sectional view showing an example of each step included in the manufacturing method of the semiconductor device according to the first embodiment.

Next, as shown in FIG. 6 and FIG. 7, the sacrificial layer SCL is patterned. In the first embodiment, the sacrificial layer SCL is patterned such that a part of the sacrificial layer SCL formed in the second opening OP2 remains. Namely, the sacrificial layer SCL is partially removed such that at least apart of the sacrificial layer SCL located on the third side surface SF3 of the first gate structure portion GSP1 and the fourth side surface SF4 of the second gate structure portion GSP2 remains.

In the first embodiment, the patterning step includes a polishing step and an etching step.

In the polishing step, as shown in FIG. 6, a part of the sacrificial layer SCL located above the first upper surface TS1 of the first gate structure portion GSP1 and the second upper surface TS2 of the second gate structure portion GSP2 is polished. The method of polishing the sacrificial layer SCL is, for example, the CMP (Chemical Mechanical Polishing) method. After the polishing step, the level difference formed by the upper surface TS1 of the first gate structure portion GSP1, the second upper surface TS2 of the second gate structure portion GSP2, and the upper surface of the sacrificial layer SCL is preferably 30 nm or less. By doing so, it is possible to prevent a high dielectric constant film HKF to be formed from being thick due to the level difference, and thus the high dielectric constant film HKF is likely to be removed properly when removed as described later. Note that the upper surface of the sacrificial layer SCL may be located inside the second opening OP2 or outside the second opening OP2.

In the etching step, as shown in FIG. 7, a part of the sacrificial layer SCL located outside the second opening OP2 is removed. Namely, a part of the sacrificial layer SCL located in each of the first opening OP1 and the third opening OP3 is removed. As a result, the first side surface SF1 of the first gate structure portion GSP1 is exposed in the first opening OP1, and the second side surface SF2 of the second gate structure portion GSP2 is exposed in the third opening OP3.

Through the steps described above, the gate structure GS1 for the control gate electrode CG is formed on the semiconductor substrate SS via the gate insulating film GIF. In the first embodiment, the gate structure GS1 includes the first gate structure portion GSP1, the sacrificial layer SCL, and the second gate structure portion GSP2. The first gate structure portion GSP1, the sacrificial layer SCL, and the second gate structure portion GSP2 are arranged in this order. In the gate structure GS1, the first gate structure portion GSP1 and the sacrificial layer SCL are adjacent to each other, and the sacrificial layer SCL and the second gate structure portion GSP2 are adjacent to each other.

2. Formation of Charge Storage Film CSF

Figure 8:
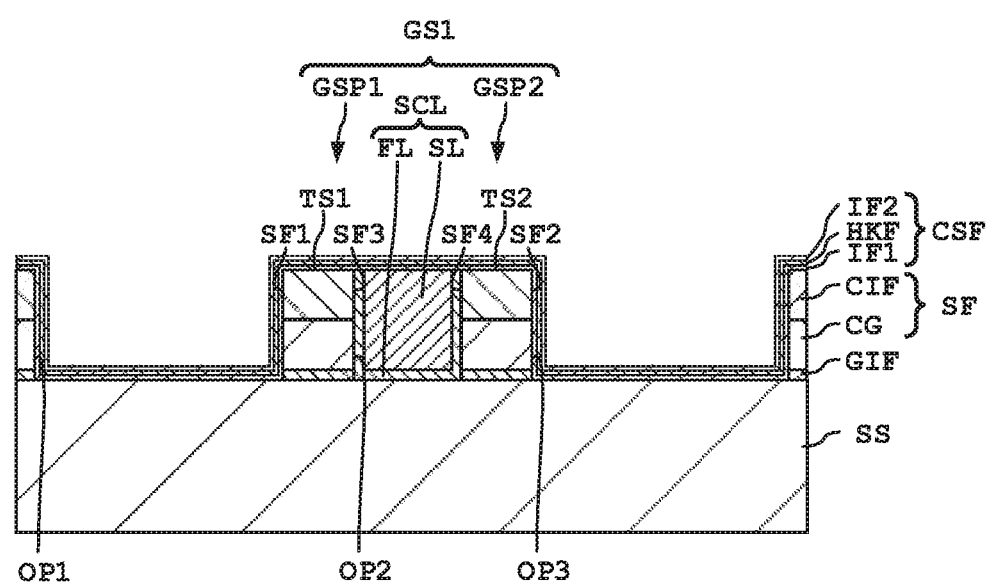
FIG. 8 is a cross-sectional view showing an example of each step included in the manufacturing method of the semiconductor device according to the first embodiment.

Next, as shown in FIG. 8, the charge storage film CSF is formed on the semiconductor substrate SS. In the first embodiment, the charge storage film CSF is formed by stacking a first insulating film IF1, the high dielectric constant film HKF, and a second insulating film IF2 in this order. The charge storage film CSF is formed on the semiconductor substrate SS so as to cover the gate structure GS1. In the first embodiment, the charge storage film CSF covers the first side surface SF1 and the first upper surface TS1 of the first gate structure portion GSP1, the upper surface of the sacrificial layer SCL, and the second side surface SF2 and the second upper surface TS2 of the second gate structure portion GSP2.

The method of forming the first insulating film IF1 is, for example, the ISSG (In Situ Steam Generation) oxidation method, the thermal oxidation method, or the CVD method. Examples of the material of the first insulating film IF1 include silicon oxide.

The method of forming the high dielectric constant film HKF is, for example, the LPCVD (Low Pressure CVD) method or the ALD (Atomic Layer Deposition) method. The high dielectric constant film HKF is an insulating film containing a material whose dielectric constant is higher than that of silicon nitride. The above-mentioned material in the high dielectric film HKF is, for example, hafnium (Hf). The high dielectric constant film HKF contains, for example, hafnium and oxygen. The high dielectric constant film HKF is, for example, a hafnium oxide film or a hafnium silicate film.

The method of forming the second insulating film IF2 is, for example, the LPCVD method or the ALD method. The second insulating film IF2 is also an insulating film whose dielectric constant is higher than that of silicon nitride. Examples of the material of the second insulating film IF2 include aluminum (Al), titanium (Ti), zirconium (Zr), yttrium (Y), lanthanum (La), praseodymium (Pr), and lutetium (Lu).

3. Formation of Conductive Film CFmg for Memory Gate Electrode MG

Figure 9:
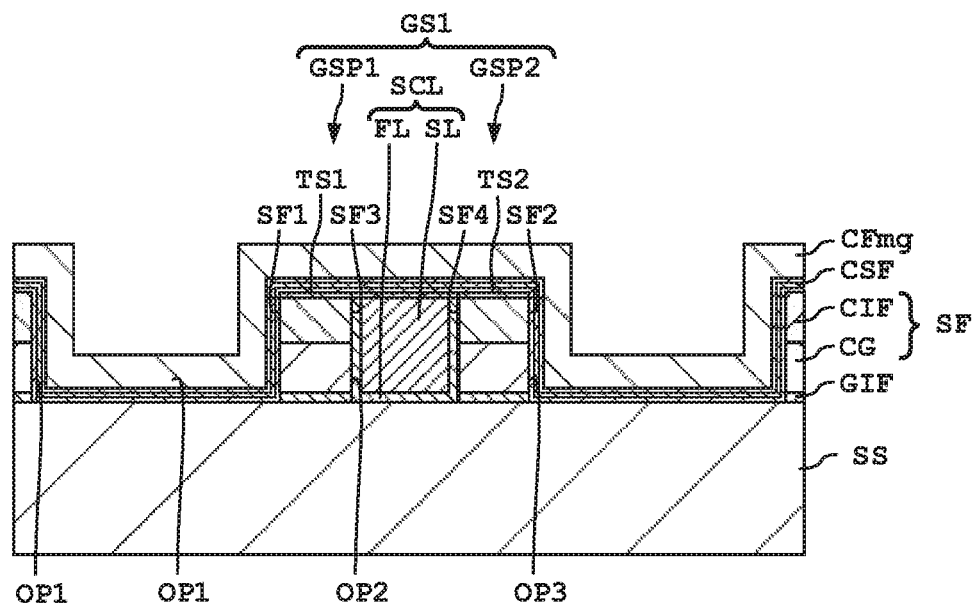
FIG. 9 is a cross-sectional view showing an example of each step included in the manufacturing method of the semiconductor device according to the first embodiment.

Next, as shown in FIG. 9, a conductive film CFmg for the memory gate electrode MG is formed on the charge storage film CSF. Examples of the method of forming the conductive film CFmg are the same as those of the method of forming the conductive film CFcg. Also, examples of the material of the conductive film CFmg are the same as those of the material of the conductive film CFcg. The material of the conductive film CFmg may be the same as that of the conductive film CFcg or may be different from that of the conductive film CFcg.

4. Formation of Memory Gate Electrode MG

Figure 10:
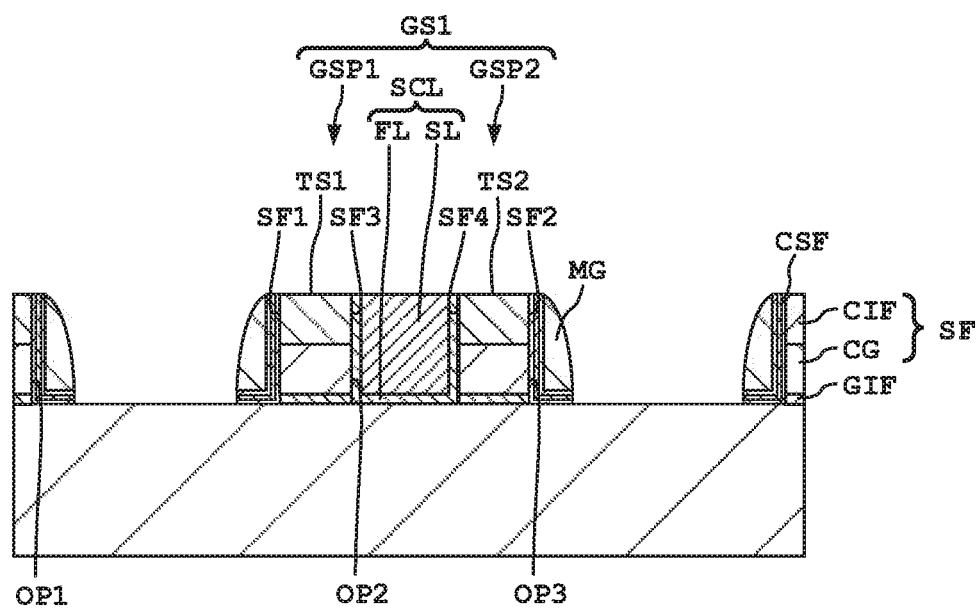
FIG. 10 is a cross-sectional view showing an example of each step included in the manufacturing method of the semiconductor device according to the first embodiment.

Next, as shown in FIG. 10, a part of the charge storage film CSF and a part of the conductive film CFmg are removed to form the memory gate electrode MG. More specifically, the etching process is performed on the semiconductor substrate SS such that the charge storage film CSF and the conductive film CFmg remain in this order on the first side surface SF1 and the second side surface SF2 of the gate structure GS1. As a result, the memory gate electrode MG with a so-called sidewall shape is formed. The sidewall shape mentioned here means the shape in which the thickness in the direction along the main surface of the semiconductor substrate SS is larger as the position gets closer to the main surface of the semiconductor substrate SS in comparison with the position away from the main surface of the semiconductor substrate SS.

Examples of the method of the etching process include the anisotropic etching method and the isotropic etching method. From the viewpoint of increasing the etching rate of the high dielectric constant film, the anisotropic etching method is preferable as the method of the etching process. In the isotropic etching, from the viewpoint of increasing the etching rate, the high-temperature condition (for example, several hundred degrees) is preferable.

Also, it is preferable that a part of the charge storage film CSF formed on the upper surface of the gate structure GS1 is also removed. Consequently, the upper surface of the sacrificial layer SCL in the gate structure GS1 is exposed. When this part is not removed in this step, the manufacturing method of the semiconductor device SD1 may separately include the step of exposing the upper surface of the sacrificial layer SCL by removing a part of the charge storage film CSF formed on the upper surface of the gate structure GS1.

Further, it is preferable that a part of the charge storage film CSF located on the main surface of the semiconductor substrate SS and exposed from the memory gate electrode MG is also removed. Consequently, a part of the semiconductor substrate SS is exposed from the memory gate electrode MG. When this part is not removed in this step, the manufacturing method of the semiconductor device SD1 may separately include the step of removing a part of the charge storage film CSF located on the main surface of the semiconductor substrate SS and exposed from the memory gate electrode MG.

5. Removal of Part of Gate Structure GS1

Figure 11:
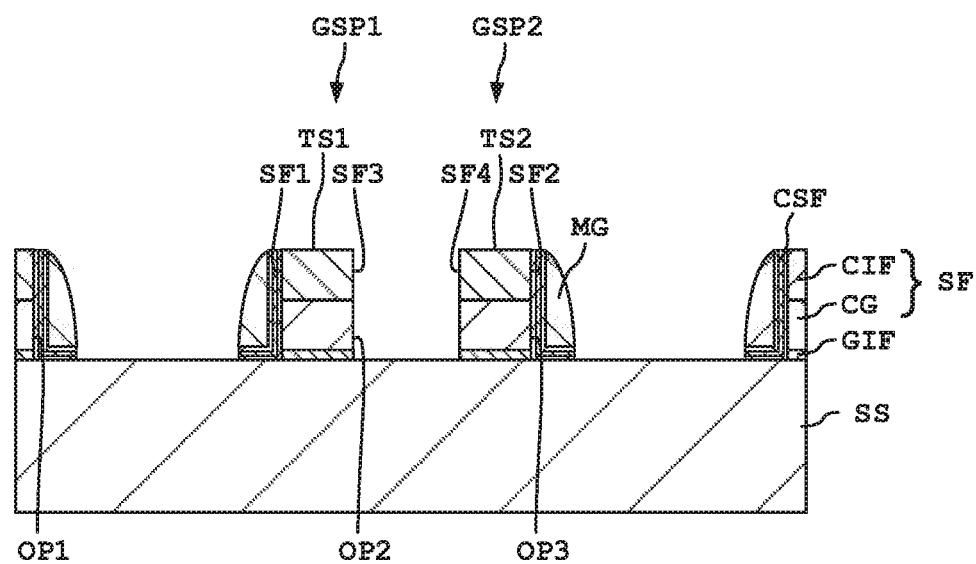
FIG. 11 is a cross-sectional view showing an example of each step included in the manufacturing method of the semiconductor device according to the first embodiment.

Next, as shown in FIG. 11, a part of the gate structure GS1 is removed. More specifically, a part of the gate structure GS1 separate from the first side surface SF1 and the second side surface SF2 is removed such that a part of the semiconductor substrate SS is exposed from the gate structure GS1. In the first embodiment, the sacrificial layer SCL is removed. The method of removing the sacrificial layer SCL is, for example, the CDE (Chemical Dry Etching) method.

6. Formation of First Impurity Region IPR1

Figure 12:
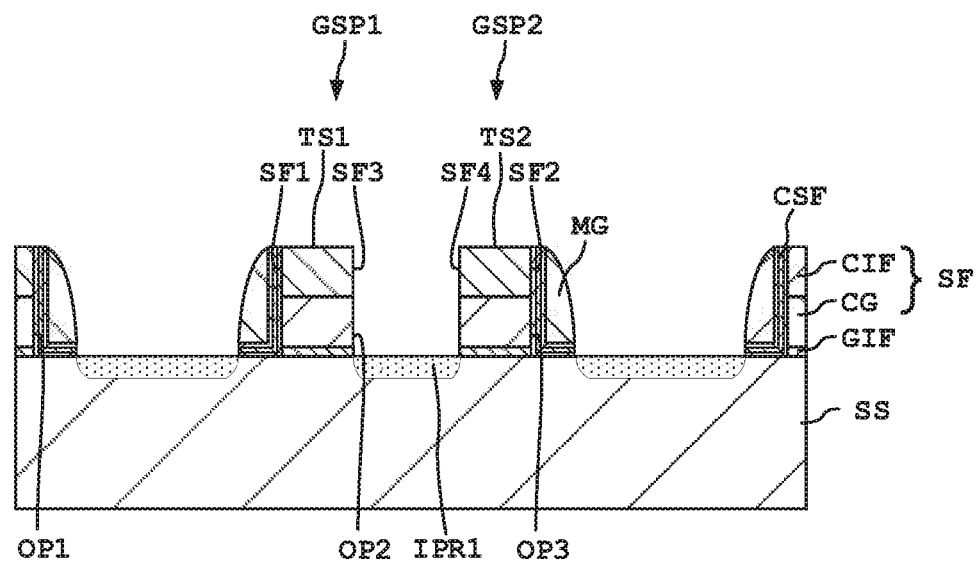
FIG. 12 is a cross-sectional view showing an example of each step included in the manufacturing method of the semiconductor device according to the first embodiment.

Next, as shown in FIG. 12, the first impurity region IPR1 is formed in the semiconductor substrate SS by the ion implantation method. At this time, the control gate electrode CG, the cap insulating film CIF, and the memory gate electrode MG are used as an implantation mask. Namely, the first impurity region IPR1 is formed in the region of the semiconductor substrate SS different from those of the control gate electrode CG, the cap insulating film CIF, and the memory gate electrode MG in plan view. The impurity used to form the first impurity region IPR1 is, for example, an n-type impurity such as phosphorus (P) or arsenic (As).

7. Formation of Sidewall SW

Figure 13:
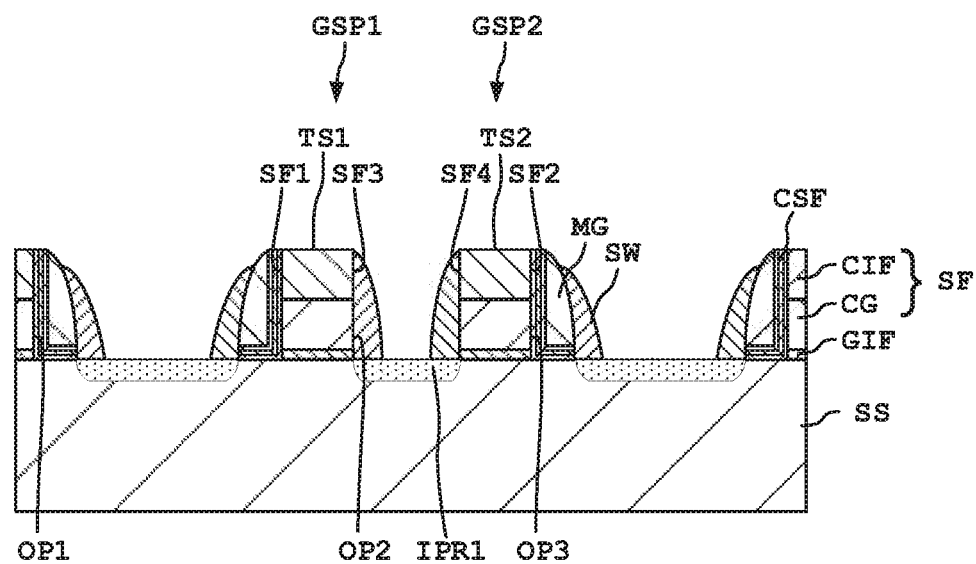
FIG. 13 is a cross-sectional view showing an example of each step included in the manufacturing method of the semiconductor device according to the first embodiment.

Next, as shown in FIG. 13, the sidewall SW is formed on each of the side surface of the control gate electrode CG, the side surface of the cap insulating film CIF, and the side surface of the memory gate electrode MG. For example, the sidewall SW can be formed by forming an insulating film made of a material of the sidewall SW on the semiconductor substrate SS so as to cover the first gate structure portion GSP1 and the second gate structure portion GSP2 by the CVD method and then removing the insulating film by etch back. The sidewall SW is, for example, a silicon oxide film, a silicon nitride film, or a stacked film of these films.

8. Formation of Second Impurity Region IPR2

Figure 14:
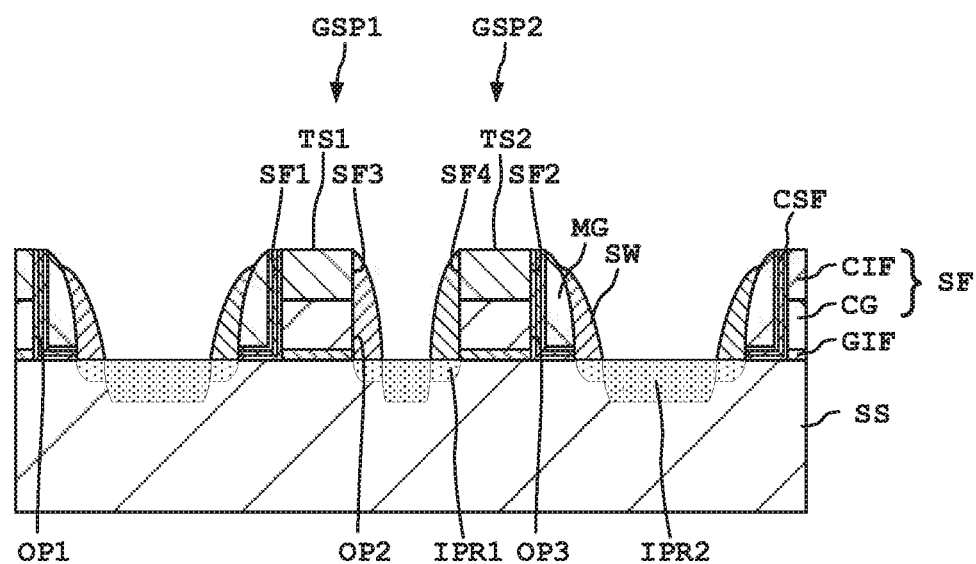
FIG. 14 is a cross-sectional view showing an example of each step included in the manufacturing method of the semiconductor device according to the first embodiment.

Next, as shown in FIG. 14, the second impurity region IPR2 is formed in the semiconductor substrate SS by the ion implantation method. At this time, the control gate electrode CG, the cap insulating film CIF, the memory gate electrode MG, and the sidewall SW are used as an implantation mask. Namely, the second impurity region IPR2 is formed in the region of the semiconductor substrate SS different from those of the control gate electrode CG, the cap insulating film CIF, the memory gate electrode MG, and the sidewall SW in plan view. The impurity used to form the second impurity region IPR2 is, for example, an n-type impurity such as phosphorus (P) or arsenic (As). The impurity concentration of the second impurity region IPR2 is preferably higher than that of the first impurity region IPR1. Note that the first impurity region IPR1 is a semiconductor region corresponding to the LDD (Lightly Doped Drain) region. The second impurity region IPR2 is a semiconductor region corresponding to the source region and/or the drain region.

9. Formation of Multilayer Wiring Layer

Figure 15:
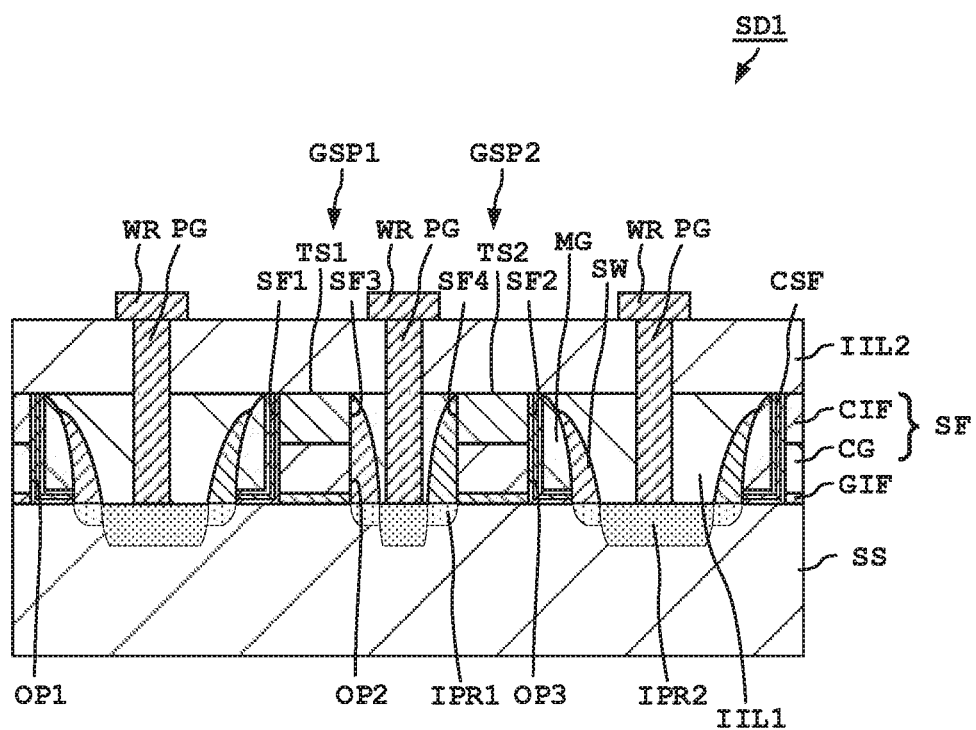
FIG. 15 is a cross-sectional view showing an example of each step included in the manufacturing method of the semiconductor device according to the first embodiment.

Next, as shown in FIG. 15, the multilayer wiring layer is formed. The multilayer wiring layer is a layer configured of two or more wiring layers. The multilayer wiring layer is a layer including an interlayer insulating layer and one or both of the wiring and the plug formed in the interlayer insulating layer. The plug is a conductor that electrically connects the two wirings formed in different layers.

In the first embodiment, the step of forming the multilayer wiring layer includes (1) a step of forming a first interlayer insulating layer IIL1, (2) a step of forming a second interlayer insulating layer IIL2, (3) a step of forming a plug PG, and (4) a step of forming a wiring WR.

(1) Formation of first interlayer insulating layer IIL1 First, the first interlayer insulating layer IIL1 is formed on the semiconductor substrate SS so as to fill the first opening OP1, the second opening OP2, and the third opening OP3. The method of forming the first interlayer insulating layer IIL1 is, for example, the CVD method. The upper surface of the first interlayer insulating layer IIL1 may be polished such that the upper surface of the cap insulating film CIF is exposed from the first interlayer insulating layer IIL1. The polishing method is, for example, the CMP method. The material of the first interlayer insulating layer IIL1 is, for example, silicon oxide.

Note that the polishing process of the first interlayer insulating layer IIL1 may be performed such that the upper surface of the control gate electrode CG is exposed. In this case, the cap insulating film CIF, a part (upper portion) of the charge storage film CSF, and a part (upper portion) of the memory gate electrode MG are removed. As a result, for example, the silicide layer can be formed on the exposed upper surface of the control gate electrode CG.

(2) Formation of Second Interlayer Insulating Layer IIL2

Next, the second interlayer insulating layer IIL2 is formed on the first interlayer insulating layer IIL1. The method of forming the second interlayer insulating layer IIL2 is, for example, the CVD method. The upper surface of the second interlayer insulating layer IIL2 may also be polished. The material of the second interlayer insulating layer IIL2 is, for example, silicon oxide.

(3) Formation of Plug PG

Next, the plug PG that reaches the second impurity region IPR2 is formed in the first interlayer insulating layer IIL1 and the second interlayer insulating layer IIL2. The well-known method as the method of forming the plug in the semiconductor technology can be adopted as the method of forming the plug PG. The plug PG is, for example, a stacked film made up of a barrier metal film and a conductive film formed on the barrier metal film. Examples of the material of the barrier metal film include titanium (Ti), titanium nitride (TiN), tantalum (Ta), and tantalum nitride (TaN). Examples of the material of the conductive film include tungsten (W), aluminum (Al), and copper (Cu).

(4) Formation of Wiring WR

Next, the wiring WR is formed on the second interlayer insulating layer IIL2. The wiring WR is electrically connected to the second impurity region IPR2 through the plug PG. The well-known method as the method of forming the wiring in the semiconductor technology can be adopted as the method of forming the wiring WR. The wiring WR may be, for example, an aluminum wiring or a copper wiring.

Although not particularly shown, the wiring layer located above the second interlayer insulating layer IIL2 in the multilayer wiring layer is formed in the same manner as the step of forming the second interlayer insulating layer IIL2, the step of forming the plug PG, and the step of forming the wiring WR.

In the manner described above, the semiconductor device SD1 according to the first embodiment is formed. Note that the manufacturing method of the semiconductor device SD1 may further include the silicide step, the dicing step, and the like as necessary.

(Function of Sacrificial Layer SCL)

Figure 16:
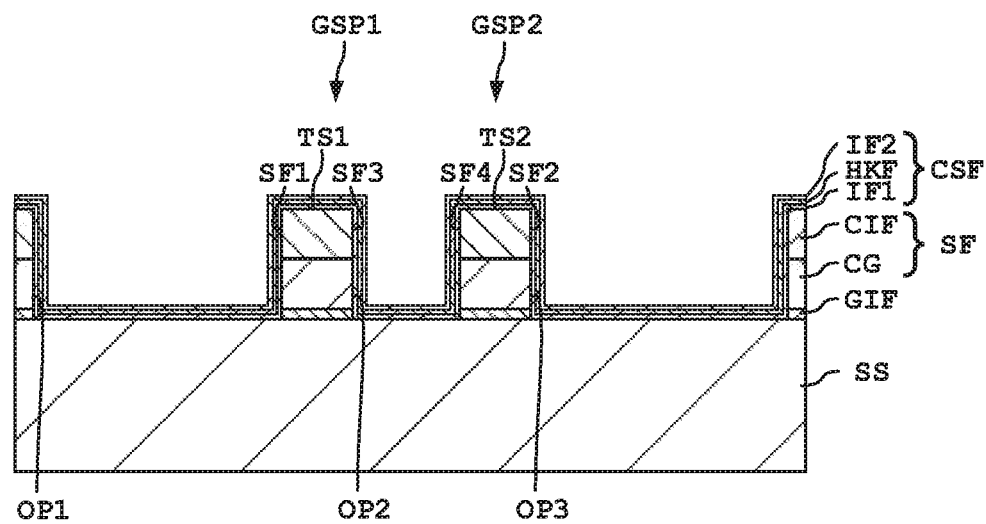
FIG. 16 is a cross-sectional view showing a step of forming a charge storage film in a manufacturing method of a semiconductor device according to a comparative example.
Figure 17:
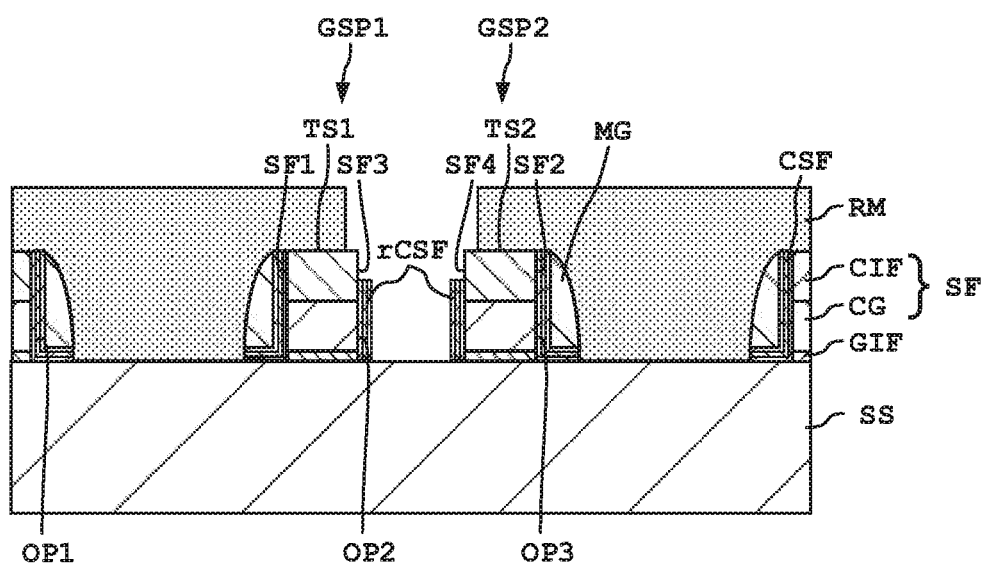
FIG. 17 is a cross-sectional view showing a state after the charge storage film is removed in the manufacturing method of the semiconductor device according to the comparative example.

Here, the function of the sacrificial layer SCL will be described. First, a comparative example of a manufacturing method of a semiconductor device that does not include the step of forming the sacrificial layer SCL will be described for the sake of comparison. FIG. 16 is a cross-sectional view showing the step of forming the charge storage film CSF in the comparative example of the manufacturing method of the semiconductor device. FIG. 17 is a cross-sectional view showing the state after removing the charge storage film CSF in the comparative example of the manufacturing method of the semiconductor device.

As shown in FIG. 16, in the comparative example of the manufacturing method of the semiconductor device, the charge storage film CSF is formed also on the third side surface SF3 of the first gate structure portion GSP1 and the fourth side surface SF4 of the second gate structure portion GSP2 in the step of forming the charge storage film CSF. Next, as shown in FIG. 17, the charge storage film CSF is removed after forming the memory gate electrode MG.

As shown in FIG. 17, when the charge storage film CSF in the second opening OP2 is removed, the charge storage film CSF is not completely removed and a residue rCSF of the charge storage film CSF remains on the inner surface of the second opening OP2 in some cases. In particular, in the case of the anisotropic etching using a resist mask RM, the etchant moves along the direction vertical to the main surface of the semiconductor substrate SS, and thus the residue rCSF of the charge storage film CSF is likely to remain on the third side surface SF3 of the first gate structure portion GSP1 and the fourth side surface SF4 of the second gate structure portion GSP2. Further, for example, when the charge storage film CSF is made of a material that is difficult to be etched (for example, material containing hafnium), the above-mentioned phenomenon becomes apparent. As a result, the residue rCSF may adhere to the unintended position of the semiconductor substrate SS in each step. Consequently, the characteristics of the semiconductor device are deteriorated. Also, the residue rCSF may become a cause for the contamination of the manufacturing apparatus. Further, in the step of forming the impurity region IPR using the control gate electrode CG as a mask, the ion implantation is hindered by the residue rCSF on the sidewall of the control gate electrode CG. As described above, in the conventional manufacturing method of the semiconductor device, the desired characteristics of the semiconductor device cannot be obtained in some cases.

On the other hand, in the first embodiment, the charge storage film CSF is not formed on the inner surface of the second opening OP2 because the sacrificial layer SCL is present in the second opening OP2. Also, since the charge storage film CSF is formed on the upper surface of the sacrificial layer SCL, the charge storage film CSF can be properly removed by the anisotropic etching.

Therefore, when compared with the conventional semiconductor device, the residue of the charge storage film CSF is not formed in the second opening OP2 in the semiconductor device SD1 according to the first embodiment. As a result, the characteristics of the semiconductor device can be enhanced in comparison with the conventional semiconductor device.

(Configuration of Semiconductor Device SD1)

As shown in FIG. 15, the semiconductor device SD1 according to the first embodiment includes the semiconductor substrate SS, the gate insulating film GIF, the control gate electrode CG, the cap insulating film CIF, the charge storage film CSF, the memory gate electrode MG, and the above-described multilayer wiring layer. The above-described multilayer wiring layer includes the first interlayer insulating layer IIL1, the second interlayer insulating layer IIL2, the plug PG, and the wiring WR.

The semiconductor substrate SS is a single crystal silicon substrate having a specific resistance of, for example, 1 Ωcm to 10 Ωcm. The semiconductor substrate SS has, for example, an impurity region containing a p-type impurity. Examples of the p-type impurity include boron (B) and aluminum (Al). The semiconductor substrate SS has an impurity region formed to configure a semiconductor element. In the first embodiment, the first impurity region IPR1 is formed as the LDD region and the second impurity region IPR2 is formed as the source region and/or drain region in the semiconductor substrate SS. Although not particularly shown, an insulating film for element isolation may be formed in the semiconductor substrate SS.

The gate insulating film GIF is formed on a part of the main surface of the semiconductor substrate SS. The gate insulating film GIF is formed between the semiconductor substrate SS and the control gate electrode CG. The material of the gate insulating film GIF is, for example, silicon oxide.

The control gate electrode CG is formed on the gate insulating film GIF. Examples of the material of the control gate electrode CG include polycrystalline silicon. The thickness of the control gate electrode CG is adjusted as appropriate in accordance with the desired thickness of the control gate electrode CG.

The cap insulating film CIF is formed on the control gate electrode CG. Examples of the material of the cap insulating film CIF include silicon oxide and silicon nitride. The cap insulating film CIF may be a single-layer film or a stacked film made up of two or more layers. It is preferable that the thickness of the cap insulating film CIF is, for example, 20 nm or more and 100 nm or less.

The charge storage film CSF is formed on the region adjacent to the control gate electrode CG on the main surface of the semiconductor substrate SS in plan view, on the side surface of the control gate electrode CG, and on the side surface of the cap insulating film CIF. The charge storage film CSF is a stacked film in which the first insulating film IF1, the high dielectric constant film HKF, and the second insulating film IF2 are stacked in this order. Examples of the material of each of the first insulating film IF1, the high dielectric constant film HKF, and the second insulating film IF2 are as described above.

The memory gate electrode MG is formed on the charge storage film CSF. Examples of the material of the memory gate electrode MG are the same as those of the material of the control gate electrode CG. The thickness of the memory gate electrode MG is determined in accordance with the total thickness of the control gate electrode CG and the cap insulating film CIF.

The multilayer wiring layer is formed on the semiconductor substrate SS so as to cover the cap insulating film CIF, the charge storage film CSF, and the memory gate electrode MG. The first interlayer insulating layer IIL1 is formed on the semiconductor substrate SS so as to fill the gaps between the two control gate electrodes CG adjacent to each other and the two memory gate electrodes MG adjacent to each other. The second interlayer insulating layer IIL2 is formed on the first interlayer insulating layer IIL1. The plug PG is formed in the first inter layer insulating layer IIL1 and the second interlayer insulating layer IIL2 so as to reach the semiconductor substrate SS. The plug PG is electrically connected to the second impurity regions IPR2 each formed between the two control gate electrodes CG adjacent to each other and the two memory electrodes MG adjacent to each other in plan view. The wiring WR is formed on the second interlayer insulating layer IIL2. The wiring WR is electrically connected to the plug PG.

(Operation of Semiconductor Device SD1)

Next, an example of the operation of the semiconductor device SD1 will be described. Hereinafter, each of the writing operation, the erasing operation, and the reading operation will be described. In the following description, the injection of electrons to the charge storage film CSF is defined as "writing" and the injection of holes is defined as "erasing".

(Writing Operation)

In the writing operation, a writing voltage for writing is applied to each of the memory gate electrode MG, the source region (second impurity region IPR2), the control gate electrode CG, the drain region (second impurity region IPR2), and the semiconductor substrate SS. Consequently, electrons are injected into the charge storage film CSF. As a result, the threshold voltage of the memory element constituting the semiconductor device SD1 is increased. In this manner, the writing operation is completed. The memory element is in the written state.

The writing voltage applied to the memory gate electrode MG is, for example, 6 V. The writing voltage applied to the source region (second impurity region IPR2) is, for example, 4 V. The writing voltage applied to the control gate electrode CG is, for example, 1 V. The writing voltage applied to the drain region (second impurity region IPR2) is, for example, 0.3 V. The writing voltage applied to the semiconductor substrate SS is, for example, 0 V.

(Erasing Operation)

In the erasing operation, an erasing voltage for erasing is applied to each of the memory gate electrode MG, the source region (second impurity region IPR2), the control gate electrode CG, the drain region (second impurity region IPR2), and the semiconductor substrate SS. Consequently, holes are injected into the charge storage film CSF. As a result, the threshold voltage of the memory element constituting the semiconductor device SD1 is decreased. In this manner, the erasing operation is completed. The memory element is in the erased state.

The erasing voltage applied to the memory gate electrode MG is, for example, −4 V. The erasing voltage applied to the source region (second impurity region IPR2) is, for example, 4 V. The erasing voltage applied to the control gate electrode CG is, for example, 0 V. The erasing voltage applied to the drain region (second impurity region IPR2) is, for example, 0 V. The erasing voltage applied to the semiconductor substrate SS is, for example, 0 V.

(Reading Operation)

In the reading operation, a reading voltage for reading is applied to each of the memory gate electrode MG, the source region (second impurity region IPR2), the control gate electrode CG, the drain region (second impurity region IPR2), and the semiconductor substrate SS. In the reading operation, the reading voltage applied to the memory gate electrode MG is set between the threshold of the memory element in the written state and the threshold of the memory element in the erased state. Consequently, no current flows in the memory element in the written state and current flows in the memory element in the erased state. In this manner, the state of the memory element is read depending on whether or not current flows in the memory element.

(Effect)

As described above, in the first embodiment, after the charge storage film CSF is formed and patterned, the sacrificial layer SCL as a part of the gate structure GS1 is removed to form the control gate electrode CG. Consequently, the charge storage film CSF is not formed on the side surface of the control gate electrode CG as described above. Therefore, it is possible to prevent the residue rCSF of the charge storage film CSF from remaining on the side surface of the control gate electrode CG. As a result, it is possible to enhance the characteristics of the semiconductor device.

[Modification of Embodiment]

FIG. 18 to FIG. 22 are cross-sectional views showing an example of each step included in a manufacturing method of a semiconductor device mSD1 according to the modification.

Figure 18:
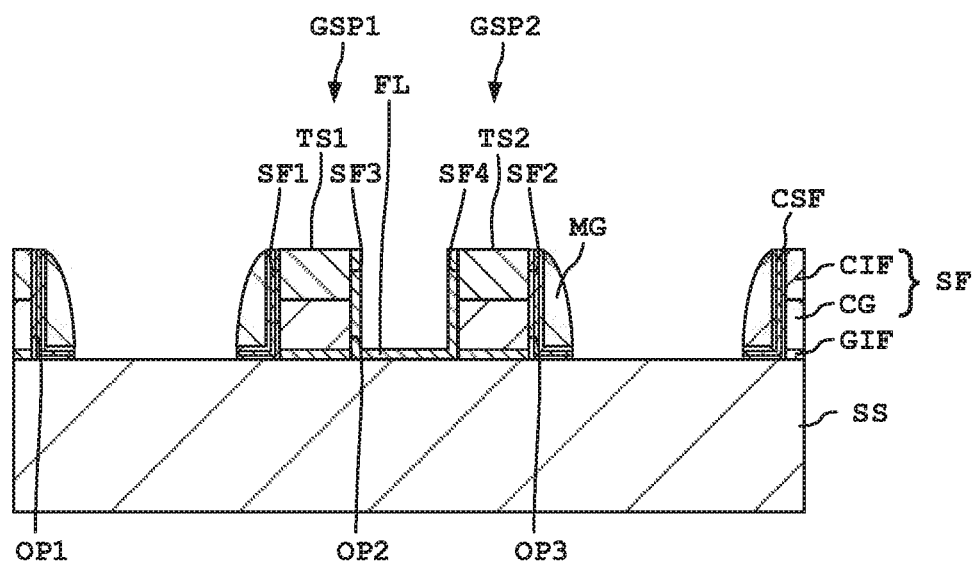
FIG. 18 is a cross-sectional view showing an example of each step included in a manufacturing method of a semiconductor device according to a modification of the first embodiment.

The manufacturing method of the semiconductor device mSD1 according to the modification includes a step of removing the second layer SL instead of the above-described step of removing the sacrificial layer SCL as shown in FIG. 18. Namely, in the step of removing the second layer SL according to the modification, the second layer SL is removed such that the first layer FL remains. Specifically, the first layer FL remains on the third side surface SF3 of the first gate structure portion GSP1, the fourth side surface SF4 of the second gate structure portion GSP2, and a part of the semiconductor substrate SS exposed in the second opening OP2.

Figure 19:
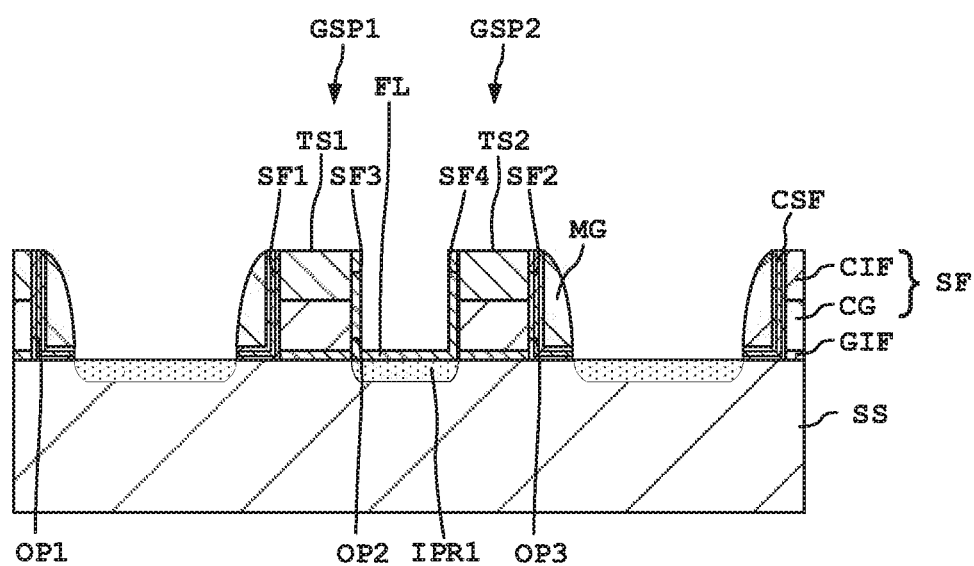
FIG. 19 is a cross-sectional view showing an example of each step included in the manufacturing method of the semiconductor device according to the modification of the first embodiment.

As shown in FIG. 19, in the step of forming the first impurity region IPR1 according to the modification, the ion implantation is performed in the state where the first layer FL is present on a part of the semiconductor substrate SS exposed in the second opening OP2. Thus, the first layer FL can be used as a so-called through film (protective film). Consequently, the drain region becomes shallower than the source region. As a result, the short channel effect is improved.

Figure 20:
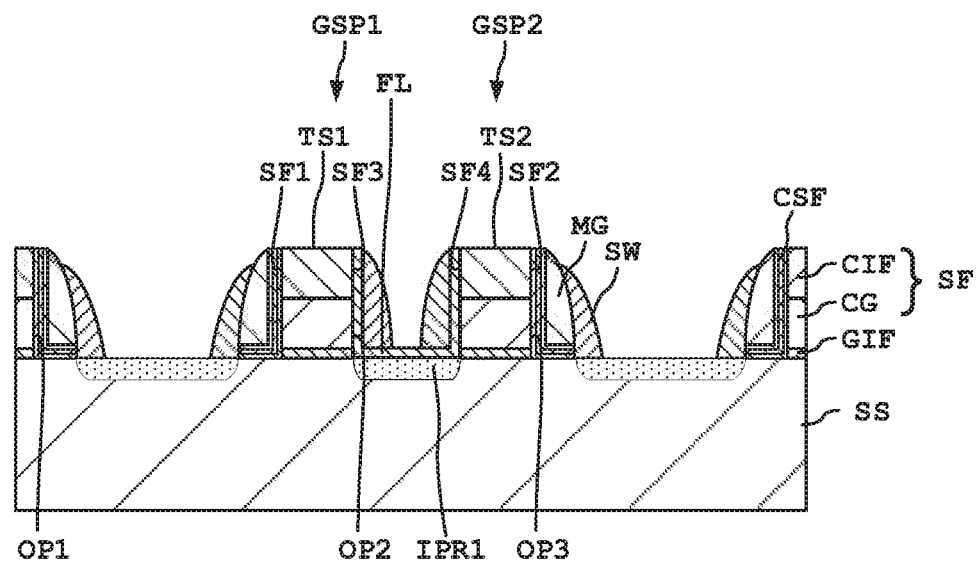
FIG. 20 is a cross-sectional view showing an example of each step included in the manufacturing method of the semiconductor device according to the modification of the first embodiment.

As shown in FIG. 20, in the step of forming the sidewall SW according to the modification, the sidewall SW on the side surface of the control gate electrode CG is formed on the third side surface SF3 of the first gate structure portion GSP1 via the first layer FL. On the other hand, the sidewall SW on the side surface of the memory gate electrode MG is formed on the fourth side surface SF4 of the second gate structure portion GSP2 without an insulating film.

Figure 21:
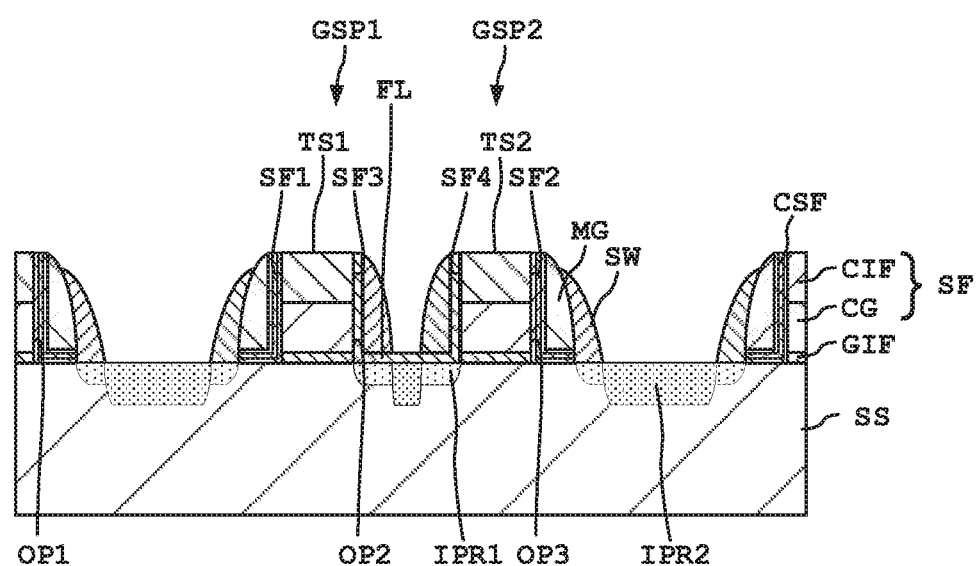
FIG. 21 is a cross-sectional view showing an example of each step included in the manufacturing method of the semiconductor device according to the modification of the first embodiment.

As shown in FIG. 21, in the step of forming the second impurity region IPR2 according to the modification, the ion implantation is performed in the state where the first layer FL is present on a part of the semiconductor substrate SS exposed in the second opening OP2.

Figure 22:
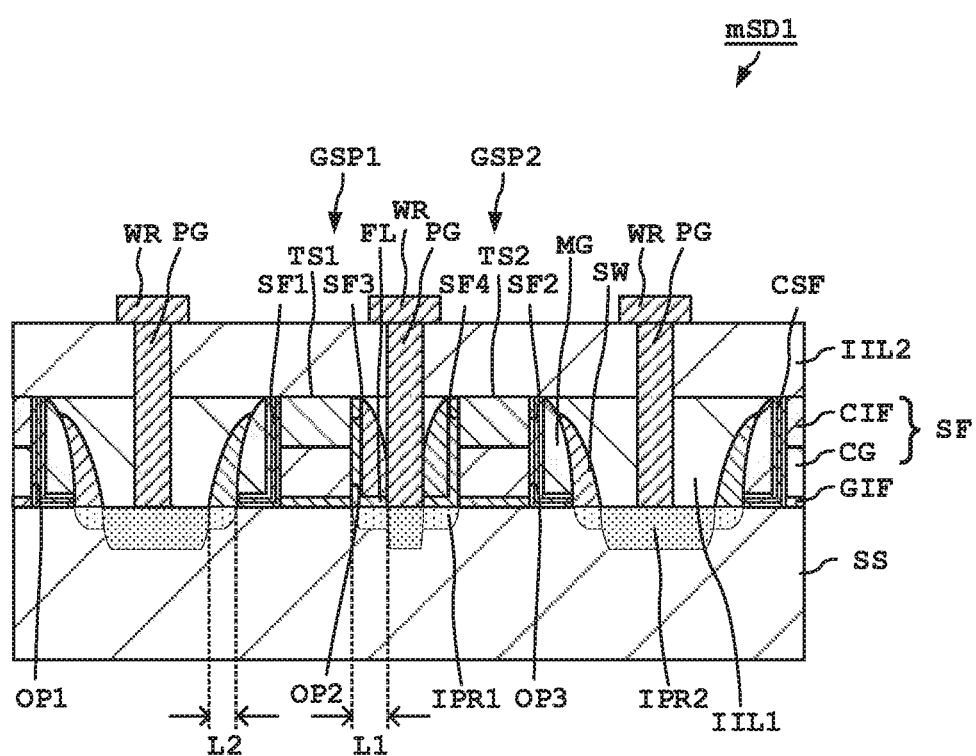
FIG. 22 is a cross-sectional view showing an example of each step included in the manufacturing method of the semiconductor device according to the modification of the first embodiment.

As shown in FIG. 22, in the step of forming the multilayer wiring layer according to the modification, the plug PG is formed so as to penetrate the first layer FL, the first interlayer insulating layer IIL1, and the second interlayer insulating layer IIL2.

As described above, in the semiconductor device mSD1 according to the modification, the first layer FL is formed on the inner surface of the second opening OP2. In other words, the first layer FL is formed between the sidewall SW formed on the side surface of the control gate electrode CG and the side surface of the control gate electrode CG. Therefore, the length L1 of the LDD region (first impurity region IPR1) located under the sidewall SW formed on the side surface of the control gate electrode CG is larger by the thickness of the first layer FL than the length L2 of the LDD region (first impurity region IPR1) located under the sidewall SW formed on the side surface of the memory gate electrode MG. If the sufficient withstand voltage can be ensured, the length L1 may be larger than the length L2. The length of the LDD region (first impurity region IPR1) mentioned here is the length of the first impurity region IPR1 in the arrangement direction of the control gate electrode CG and the memory gate electrode MG (see FIG. 22).

In the modification described above, the case where the manufacturing method of the semiconductor device mSD1 does not include the step of removing the first layer FL has been described, but the present embodiment is not limited to this. For example, the manufacturing method of the semiconductor device may include the step of removing the first layer FL after the step of forming the first impurity region IRP1 and before the step of forming the sidewall SW.

Second Embodiment (Manufacturing Method of Semiconductor Device)

A manufacturing method of a semiconductor device SD2 according to the second embodiment is mainly different from the manufacturing method of the semiconductor device SD1 according to the first embodiment in a configuration of a gate structure GS2. Thus, the same components as those of the first embodiment or corresponding components to those of the first embodiment are denoted by the same reference signs and the description thereof will be omitted.

An example of the manufacturing method of the semiconductor device SD2 according to the second embodiment will be described. FIG. 23 to FIG. 33 are cross-sectional views showing an example of each step included in the manufacturing method of the semiconductor device SD2.

The manufacturing method of the semiconductor device SD2 according to the second embodiment includes 1. a step of forming a gate structure GS2, 2. a step of forming a charge storage film CSF, 3. a step of forming a conductive film CFmg for a memory gate electrode MG, 4. a step of forming the memory gate electrode MG, 5. a step of removing a part of the gate structure GS2, 6. a step of forming a first impurity region IPR1, 7. a step of forming a sidewall SW, 8. a step of forming a second impurity region IPR2, and 9. a step of forming a multilayer wiring layer.

1. Formation of Gate Structure GS2

The step of forming the gate structure GS2 includes (1) a step of preparing a semiconductor substrate SS, (2) a step of forming a stacked film SF, and (3) a step of removing a part of the stacked film SF.

(1) Preparation of Semiconductor Substrate SS

Figure 23:
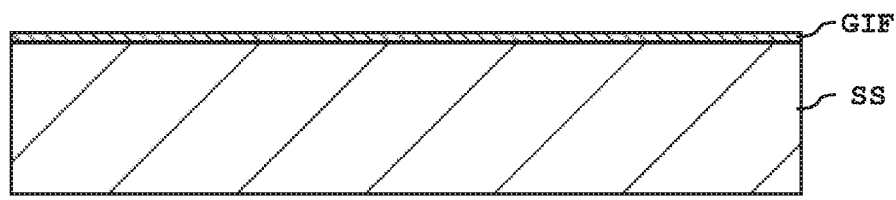
FIG. 23 is a cross-sectional view showing an example of each step included in a manufacturing method of a semiconductor device according to the second embodiment.

First, as shown in FIG. 23, the semiconductor substrate SS is prepared, and a gate insulating film GIF is formed on the semiconductor substrate SS. Since this is the same as that of the first embodiment, the description thereof is omitted.

(2) Formation of Stacked Film SF

Figure 24:
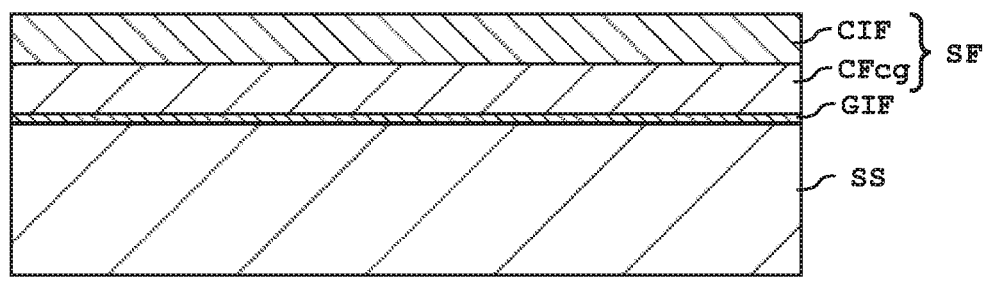
FIG. 24 is a cross-sectional view showing an example of each step included in the manufacturing method of the semiconductor device according to the second embodiment.

Next, as shown in FIG. 24, the stacked film SF in which a conductive film CFcg for the control gate electrode CG and a cap insulating film CIF are stacked in this order is formed on the gate insulating film GIF. Since the method of forming the stacked film SF in the second embodiment is the same as that of the first embodiment, the description thereof is omitted.

(3) Removal of Part of Stacked Film SF

Figure 25:
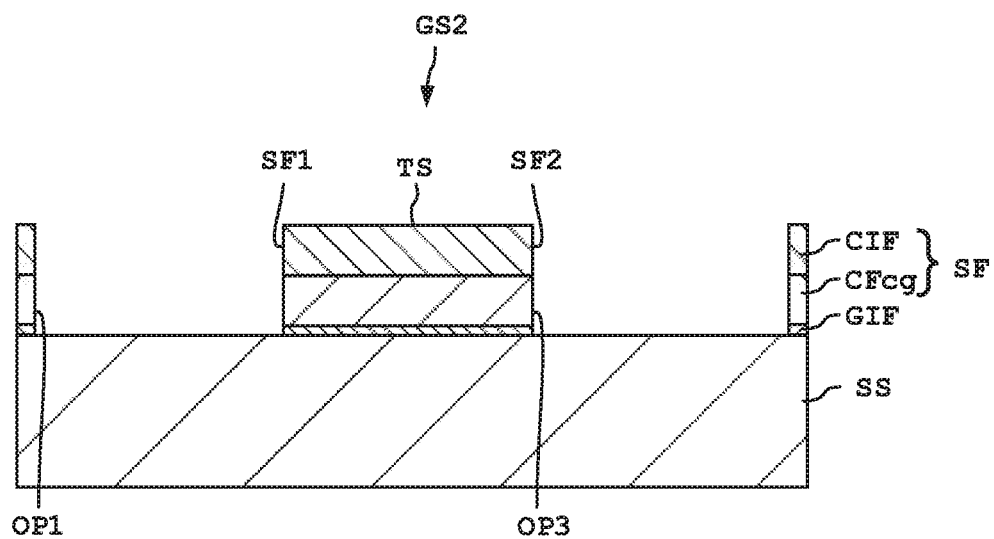
FIG. 25 is a cross-sectional view showing an example of each step included in the manufacturing method of the semiconductor device according to the second embodiment.

Next, as shown in FIG. 25, a part of the stacked film SF is removed. Consequently, the gate structure GS2 for the control gate electrode CG made of the other part of the stacked film SF is formed. The gate structure GS2 has a first side surface SF1 and a second side surface SF2 on opposite sides to each other, and an upper surface TS. A part of the stacked film SF is removed by, for example, the photolithography method and the etching method. In the second embodiment, the first opening OP1 and the third opening OP3 in the first embodiment are formed. On the other hand, in this step, the second opening OP2 formed between the two adjacent control gate electrodes CG is not formed in the manufactured semiconductor device SD2.

2. Formation of Charge Storage Film CSF

Figure 26:
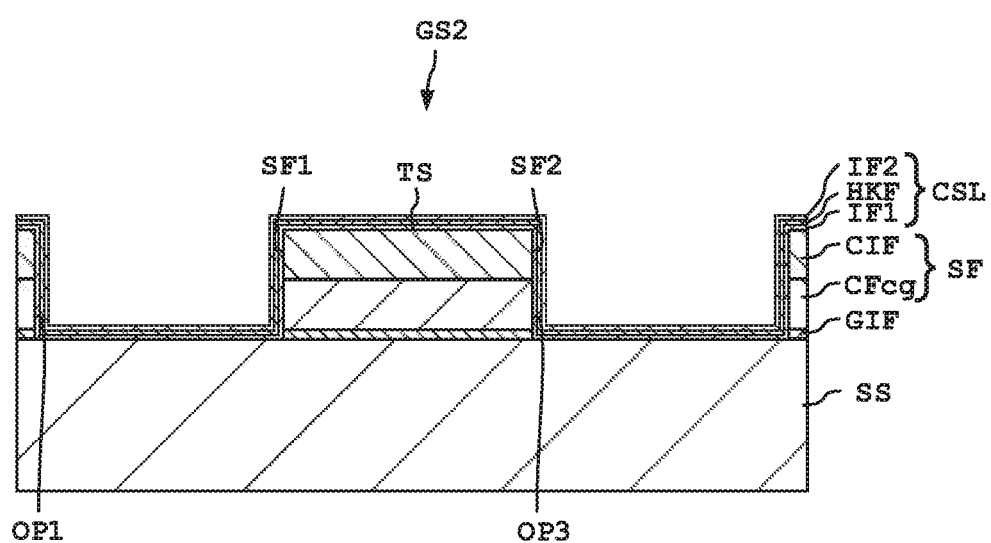
FIG. 26 is a cross-sectional view showing an example of each step included in the manufacturing method of the semiconductor device according to the second embodiment.

Next, as shown in FIG. 26, the charge storage film CSF is formed on the semiconductor substrate SS so as to cover the gate structure GS2. In the second embodiment, it covers the first side surface SF1, the second side surface SF2, and the upper surface TS of the gate structure GS2.

3. Formation of Conductive Film CFmg for Memory Gate Electrode MG

Figure 27:
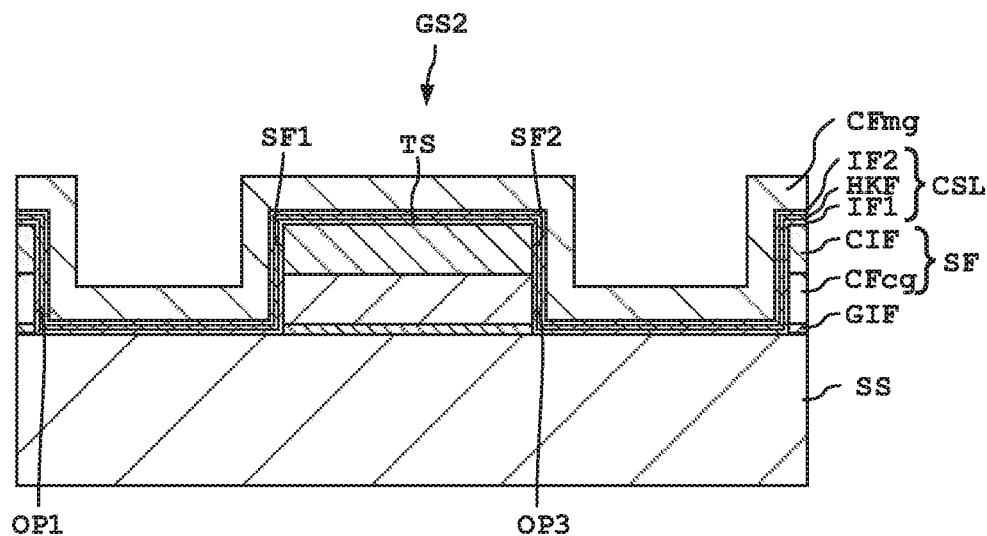
FIG. 27 is a cross-sectional view showing an example of each step included in the manufacturing method of the semiconductor device according to the second embodiment.

Next, as shown in FIG. 27, the conductive film CFmg for the memory gate electrode MG is formed on the charge storage film CSF. Examples of the method of forming the conductive film CFmg are the same as those of the first embodiment.

4. Formation of Memory Gate Electrode MG

Figure 28:
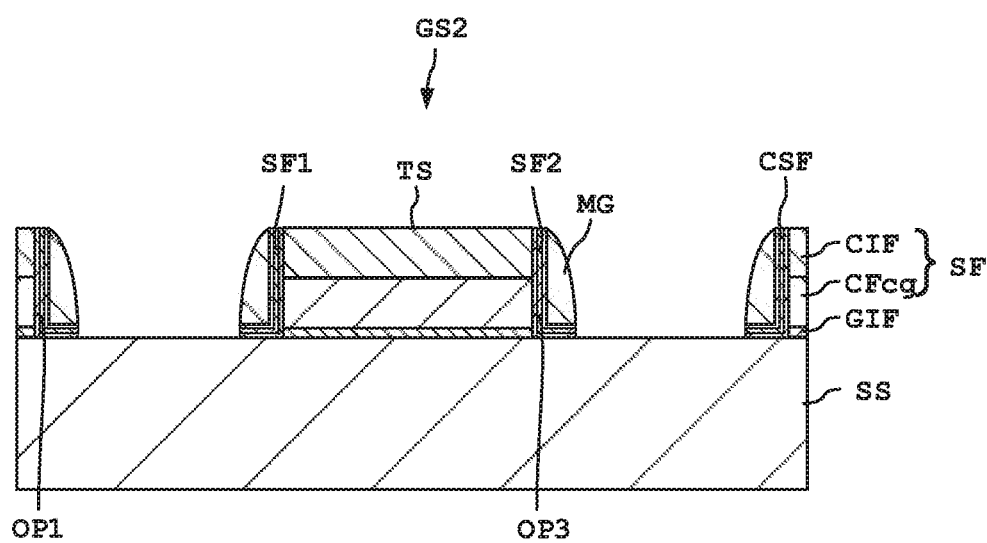
FIG. 28 is a cross-sectional view showing an example of each step included in the manufacturing method of the semiconductor device according to the second embodiment.

Next, as shown in FIG. 28, a part of the charge storage film CSF and a part of the conductive film CFmg are removed to form the memory gate electrode MG. A method of forming the memory gate electrode MG is the same as that of the first embodiment.

5. Removal of Part of Gate Structure GS2

Figure 29:
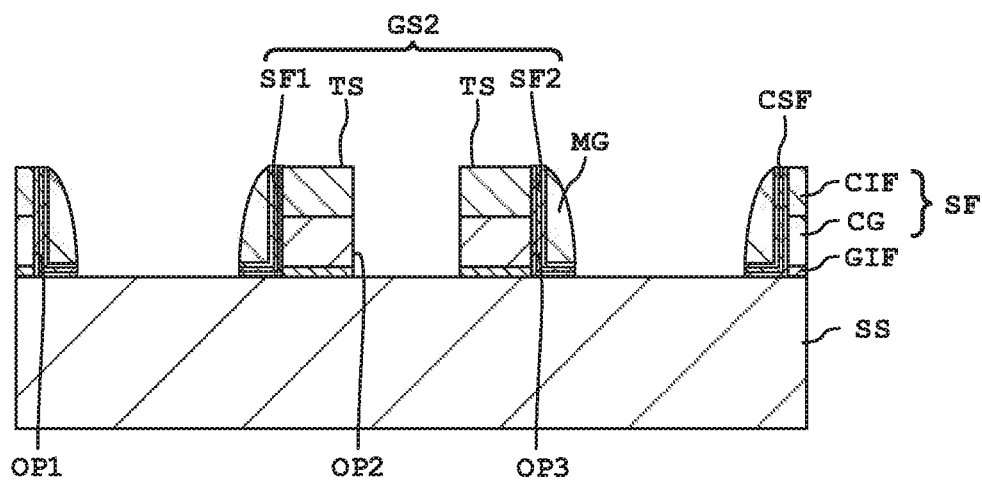
FIG. 29 is a cross-sectional view showing an example of each step included in the manufacturing method of the semiconductor device according to the second embodiment.

Next, as shown in FIG. 29, a part of the gate structure GS2 is removed. More specifically, a part of the gate structure GS2 separate from the first side surface SF1 and the second side surface SF2 is removed so as to expose a part of the semiconductor substrate SS from the gate structure GS2. Consequently, the control gate electrode CG and the second opening OP2 are formed. In the second embodiment, a part of the stacked film SF and a part of the gate insulating film GIF are removed. A part of the stacked film SF removed in this step is adjusted as appropriate in accordance with the desired position of the control gate electrode CG. A part of the gate structure GS2 (stacked film SF) is removed by, for example, the photolithography method and the etching method.

6. Formation of First Impurity Region IPR1

Figure 30:
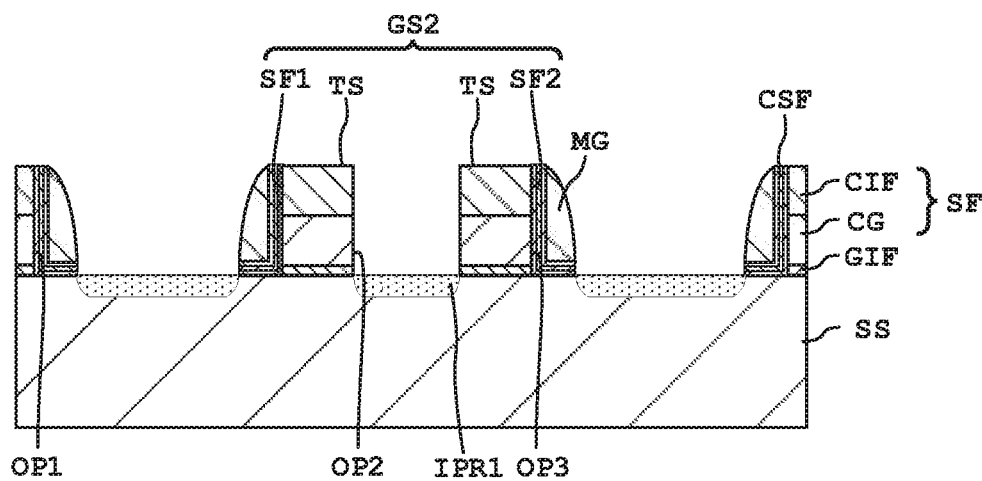
FIG. 30 is a cross-sectional view showing an example of each step included in the manufacturing method of the semiconductor device according to the second embodiment.

Next, as shown in FIG. 30, the first impurity region IPR1 is formed in the semiconductor substrate SS by the ion implantation method. The method of forming the first impurity region IPR1 is the same as that of the first embodiment.

7. Formation of Sidewall SW

Figure 31:
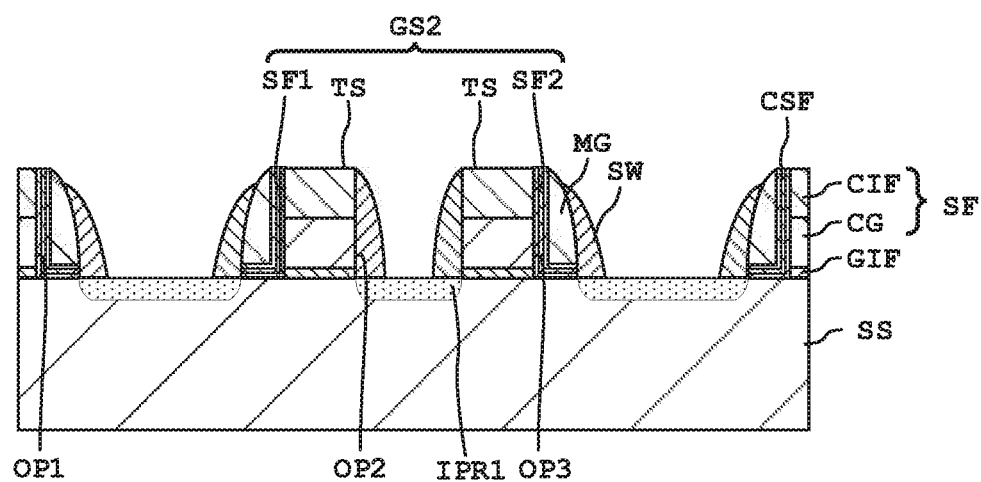
FIG. 31 is a cross-sectional view showing an example of each step included in the manufacturing method of the semiconductor device according to the second embodiment.

Next, as shown in FIG. 31, the sidewall SW is formed on each of the side surface of the control gate electrode CG, the side surface of the cap insulating film CIF, and the side surface of the memory gate electrode MG. The method of forming the sidewall SW is the same as that of the first embodiment.

8. Formation of Second Impurity Region IPR2

Figure 32:
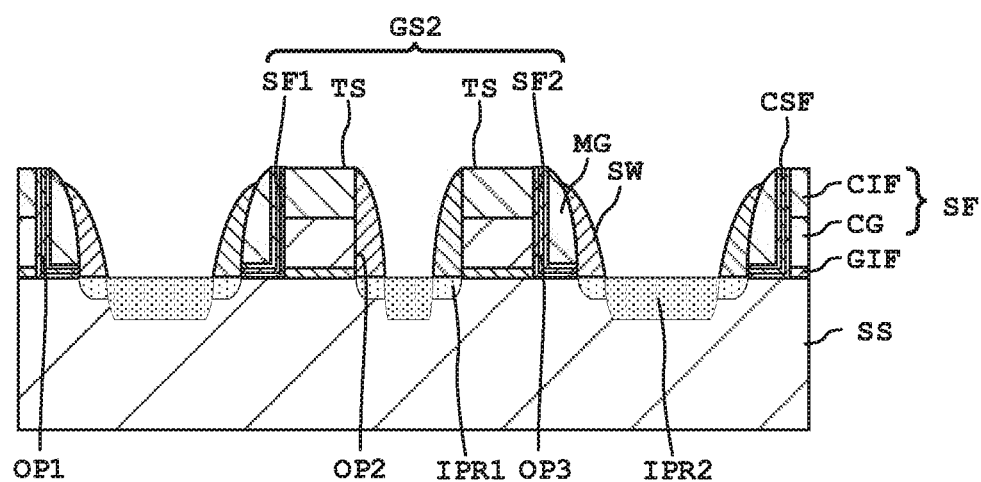
FIG. 32 is a cross-sectional view showing an example of each step included in the manufacturing method of the semiconductor device according to the second embodiment.

Next, as shown in FIG. 32, the second impurity region IPR2 is formed in the semiconductor substrate SS by the ion implantation method. The method of forming the second first impurity region IPR2 is the same as that of the first embodiment.

9. Formation of Multilayer Wiring Layer

Figure 33:
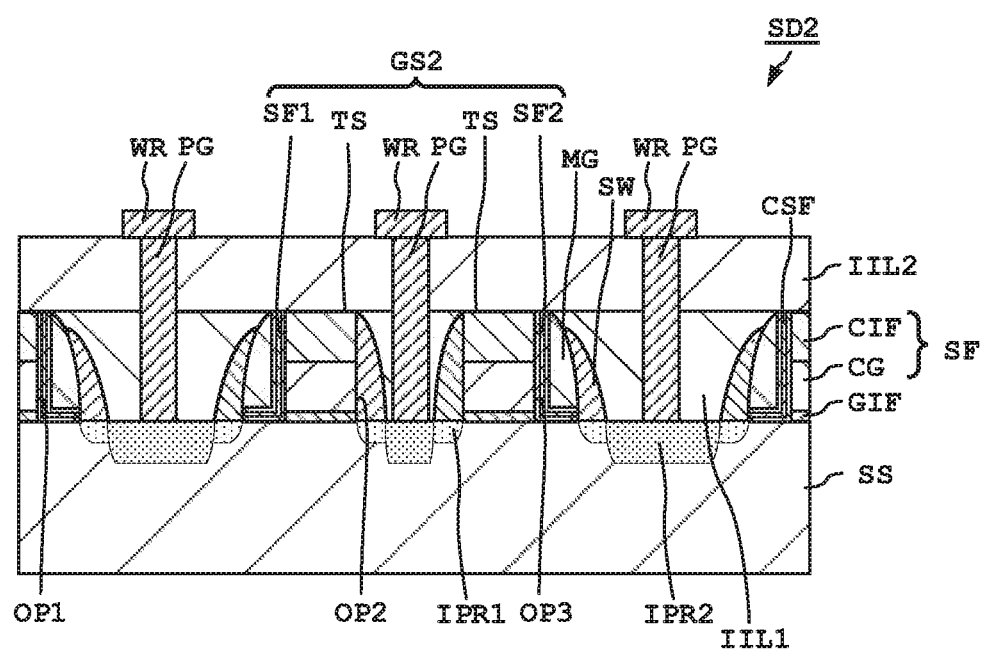
FIG. 33 is a cross-sectional view showing an example of each step included in the manufacturing method of the semiconductor device according to the second embodiment.

Next, as shown in FIG. 33, the multilayer wiring layer is formed on the semiconductor substrate SS. The method of forming the multilayer wiring layer is the same as that of the first embodiment.

In the manner described above, the semiconductor device SD2 according to the second embodiment is formed. The configuration of the semiconductor device SD2 is the same as that of the semiconductor device SD1 according to the first embodiment.

(Effect)

As described above, in the second embodiment, after the charge storage film CSF is formed and patterned, a part of the stacked film SF as a part of the gate structure GS2 is removed to form the control gate electrode CG. Consequently, the same effect as that of the first embodiment can be achieved. Further, in the manufacturing method of the gate structure GS2 according to the second embodiment, the sacrificial layer SCL is not formed. Therefore, the manufacturing method of the semiconductor device SD2 according to the second embodiment is simpler. In addition, the gate structure GS2 is formed by the patterning performed in two steps (so-called double patterning technology). Therefore, the manufacturing method of the semiconductor device SD2 according to the second embodiment is more preferable from the viewpoint of the miniaturization of the semiconductor element. Namely, the second embodiment is more preferable from the viewpoint of the reduction in size and cost of the semiconductor device.

Note that the present invention is not limited to the embodiments described above and various modifications can be made without departing from the gist of the invention. For example, the case where the high dielectric constant film HKF and the second insulating film IF2 in the charge storage film CSF contain the material whose dielectric constant is higher than that of silicon nitride has been described. However, the other embodiment of the present invention is not limited to this configuration. For example, one or both of the high dielectric constant film HKF and the second insulating film IF2 may not contain the material whose dielectric constant is higher than that of silicon nitride. In this case, the material of the film corresponding to the high dielectric constant film HKF is silicon oxynitride, silicon carbide, or silicon carbonitride, and the material of the second insulating film IF2 is silicon oxide.

Also, in the embodiments described above, the memory gate electrode MG has the sidewall shape. However, the cross-sectional shape of the memory gate electrode MG may be a rectangular shape.

What is claimed is:

1. A manufacturing method of a semiconductor device, the manufacturing method comprising:
   (a) forming a gate structure for a control gate electrode on a semiconductor substrate via a gate insulating film;
   (b) forming a charge storage film on the semiconductor substrate so as to cover a first side surface, a second side surface, and an upper surface of the gate structure;
   (c) forming a first conductive film for a memory gate electrode on the charge storage film;
   (d) removing a part of the charge storage film and a part of the first conductive film such that the charge storage film and the first conductive film remain in this order on the first side surface and the second side surface of the gate structure on the semiconductor substrate, thereby forming the memory gate electrode; and
   (e) removing a part of the gate structure separate from the first side surface and the second side surface such that a part of the semiconductor substrate is exposed from the gate structure,
   wherein the (a) includes:
   (a1) forming a stacked film in which a second conductive film for a control gate electrode and a cap insulating film are stacked in this order, on the gate insulating film;
   (a2) forming a first gate structure portion and a second gate structure portion separate from each other by removing a part of the stacked film; and
   (a3) forming a sacrificial layer on the semiconductor substrate so as to fill an opening formed between the first gate structure portion and the second gate structure portion, and
   wherein the sacrificial layer is removed in the (e).

2. The manufacturing method of the semiconductor device according to claim 1, wherein the (a3) includes:
   (a3-1) forming a first layer on an inner surface of the opening; and
   (a3-2) forming a second layer on the first layer so as to fill the opening.

3. The manufacturing method of the semiconductor device according to claim 1, wherein the gate structure includes:
   the first gate structure portion having the first side surface and a third side surface located on an opposite side to the first side surface;
   the second gate structure portion having the second side surface and a fourth side surface located on an opposite side to the second side surface; and
   the sacrificial layer formed between the third side surface and the fourth side surface.

4. The manufacturing method of the semiconductor device according to claim 1, wherein the (a3) includes:
   (a3-1) forming the sacrificial layer on the semiconductor substrate so as to cover the first gate structure portion and the second gate structure portion; and
   (a3-2) patterning the sacrificial layer such that a part of the sacrificial layer formed in the opening formed between the first gate structure portion and the second gate structure portion remains.

5. The manufacturing method of the semiconductor device according to claim 4, wherein the (a3-2) includes:
   polishing a part of the sacrificial layer located above a first upper surface of the first gate structure portion and a part of the sacrificial layer located above a second upper surface of the second gate structure portion; and
   removing a part of the sacrificial layer located outside the opening.

6. The manufacturing method of the semiconductor device according to claim 1, wherein a material of the sacrificial layer is polycrystalline silicon.

7. The manufacturing method of the semiconductor device according to claim 1, wherein a part of the gate structure is removed by anisotropic etching in the (e).

8. The manufacturing method of the semiconductor device according to claim 1,
   wherein, in the (b), a stacked film in which a first insulating film, a high dielectric constant film, and a second insulating film are formed in this order is formed as the charge storage film, and
   wherein the high dielectric constant film contains a material whose dielectric constant is higher than that of silicon nitride.

9. The manufacturing method of the semiconductor device according to claim 8, wherein the material in the high dielectric constant film is hafnium.

10. The manufacturing method of the semiconductor device according to claim 8, wherein the second insulating film contains a material whose dielectric constant is higher than that of silicon nitride.

11. The manufacturing method of the semiconductor device according to claim 1, further comprising, after the (e),
    (f) forming an impurity region in the semiconductor substrate by an ion implantation method using the control gate electrode as an implantation mask.

12. A manufacturing method of a semiconductor device, the manufacturing method comprising:
- (a) forming a gate structure for a control gate electrode on a semiconductor substrate via a gate insulating film;
- (b) forming a charge storage film on the semiconductor substrate so as to cover a first side surface, a second side surface, and an upper surface of the gate structure;
- (c) forming a first conductive film for a memory gate electrode on the charge storage film;
- (d) removing a part of the charge storage film and a part of the first conductive film such that the charge storage film and the first conductive film remain in this order on the first side surface and the second side surface of the gate structure on the semiconductor substrate, thereby forming the memory gate electrode; and
- (e) removing a part of the gate structure separate from the first side surface and the second side surface such that a part of the semiconductor substrate is exposed from the gate structure, wherein the (a) includes:
- (a1) forming a stacked film in which a second conductive film for a control gate electrode and a cap insulating film are stacked in this order, on the gate insulating film; and
- (a2) removing a part of the stacked film to form the gate structure configured of the other part of the stacked film.

* * * * *